United States Patent
Naruse

(10) Patent No.: US 10,707,159 B2
(45) Date of Patent: Jul. 7, 2020

(54) SEMICONDUCTOR DEVICE, CHIP MODULE, AND SEMICONDUCTOR MODULE

(71) Applicant: AISIN AW CO., LTD., Anjo-shi, Aichi-ken (JP)

(72) Inventor: Takanobu Naruse, Nishio (JP)

(73) Assignee: AISIN AW CO., LTD., Anjo-shi, Aichi-ken (JP)

( * ) Notice: Subject to any disclaimer, the term of this patent is extended or adjusted under 35 U.S.C. 154(b) by 310 days.

(21) Appl. No.: 15/742,269

(22) PCT Filed: Aug. 31, 2016

(86) PCT No.: PCT/JP2016/075578
§ 371 (c)(1),
(2) Date: Jan. 5, 2018

(87) PCT Pub. No.: WO2017/038905
PCT Pub. Date: Mar. 9, 2017

(65) Prior Publication Data
US 2018/0197801 A1    Jul. 12, 2018

(30) Foreign Application Priority Data

Aug. 31, 2015   (JP) .................................. 2015-170409

(51) Int. Cl.
*H01L 23/498* (2006.01)
*H05K 1/02* (2006.01)
(Continued)

(52) U.S. Cl.
CPC ........ *H01L 23/49838* (2013.01); *H01L 23/12* (2013.01); *H01L 23/50* (2013.01);
(Continued)

(58) Field of Classification Search
CPC ... H01L 23/49838; H01L 23/50; H01L 24/48; H05K 1/0262; H05K 1/112; H05K 1/0263; H05K 3/429
See application file for complete search history.

(56) References Cited

U.S. PATENT DOCUMENTS

| 6,121,554 A | 9/2000 | Kamikawa |
| 2003/0042566 A1 | 3/2003 | Chang et al. |

(Continued)

FOREIGN PATENT DOCUMENTS

| JP | 10-303562 A | 11/1998 |
| JP | 2000-349448 A | 12/2000 |

(Continued)

OTHER PUBLICATIONS

Communication dated Oct. 15, 2018 from the European Patent Office in counterpart application No. 16841935.6.
International Search Report for PCT/JP2016/075578 dated Oct. 18, 2016.

*Primary Examiner* — Zandra V Smith
*Assistant Examiner* — Abbigale A Boyle
(74) *Attorney, Agent, or Firm* — Sughrue Mion, PLLC

(57) ABSTRACT

Provided is a semiconductor device having a surface layer power supply path in a surface layer wiring layer, on which a chip module is mounted, of a main substrate that has a plurality of wiring layers and through holes, the surface layer power supply path supplying power to a semiconductor chip via an inner peripheral-side power supply terminal group and an outer peripheral-side power supply terminal group. The surface layer power supply path overlaps the inner peripheral-side power supply terminal group and the outer peripheral-side power supply terminal group as seen in the orthogonal direction, and is formed continuously so as to extend in a direction from a position at which the surface layer power supply path is connected to the inner peripheral-side power supply terminal group toward the outer peripheral side of the main substrate.

30 Claims, 14 Drawing Sheets

(51) Int. Cl.
  *H05K 1/11*   (2006.01)
  *H05K 3/46*   (2006.01)
  *H01L 23/50*  (2006.01)
  *H05K 3/42*   (2006.01)
  *H01L 23/00*  (2006.01)
  *H01L 23/12*  (2006.01)

(52) U.S. Cl.
  CPC ........... *H01L 24/48* (2013.01); *H05K 1/0262* (2013.01); *H05K 1/0263* (2013.01); *H05K 1/112* (2013.01); *H05K 3/429* (2013.01); *H05K 3/46* (2013.01); *H01L 2224/48091* (2013.01); *H01L 2224/48227* (2013.01); *H01L 2924/15311* (2013.01); *H01L 2924/181* (2013.01)

(56) References Cited

U.S. PATENT DOCUMENTS

| | | | |
|---|---|---|---|
| 2004/0061242 A1 | 4/2004 | Osburn | |
| 2009/0085158 A1 | 4/2009 | Shah | |
| 2012/0211897 A1* | 8/2012 | Hoshi | H01L 23/49822 257/774 |

FOREIGN PATENT DOCUMENTS

| | | |
|---|---|---|
| JP | 2011-124549 A | 6/2011 |
| JP | 2016-134543 A | 7/2016 |

\* cited by examiner

Fig.3
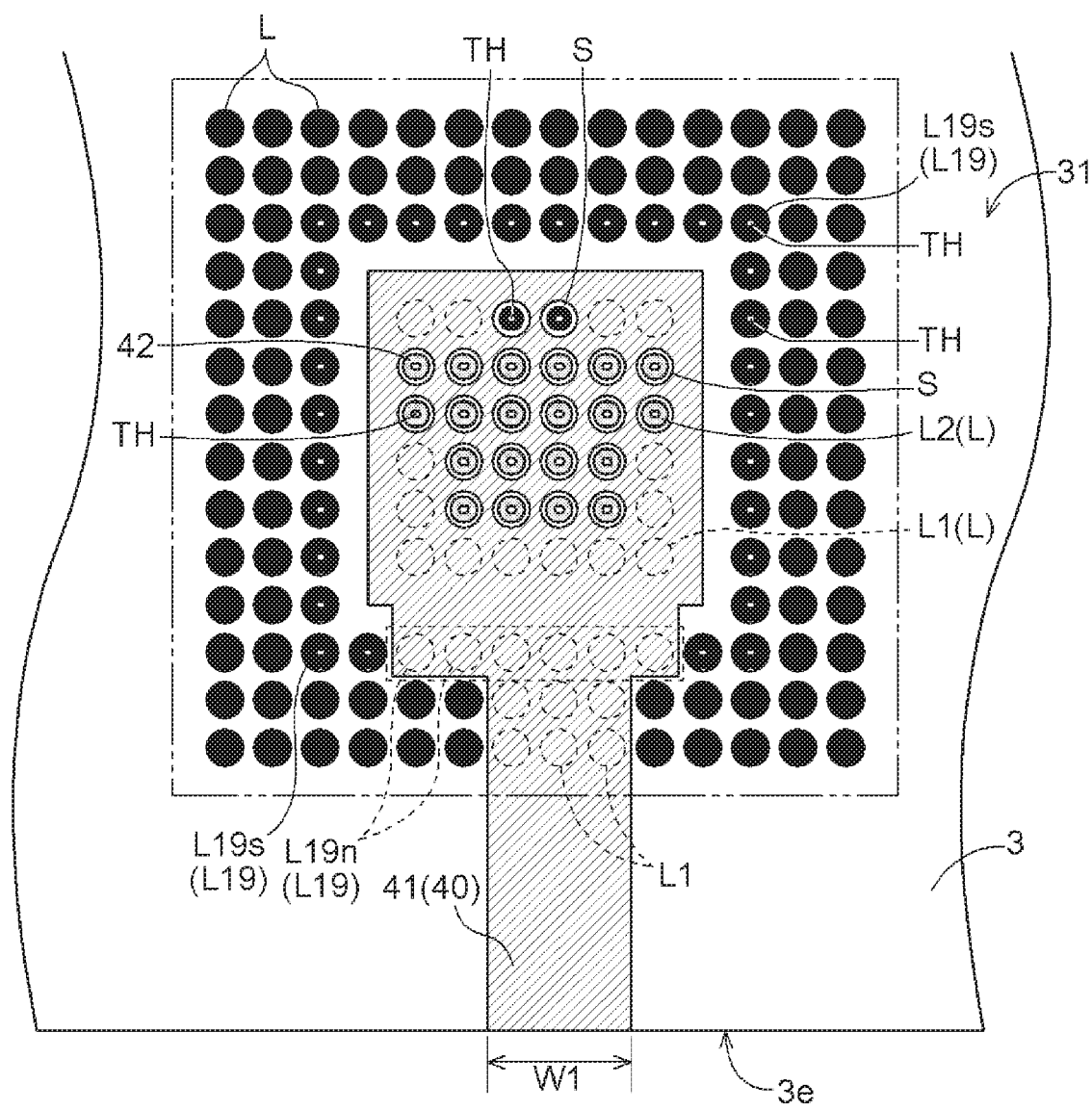
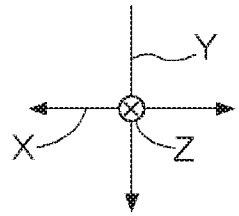

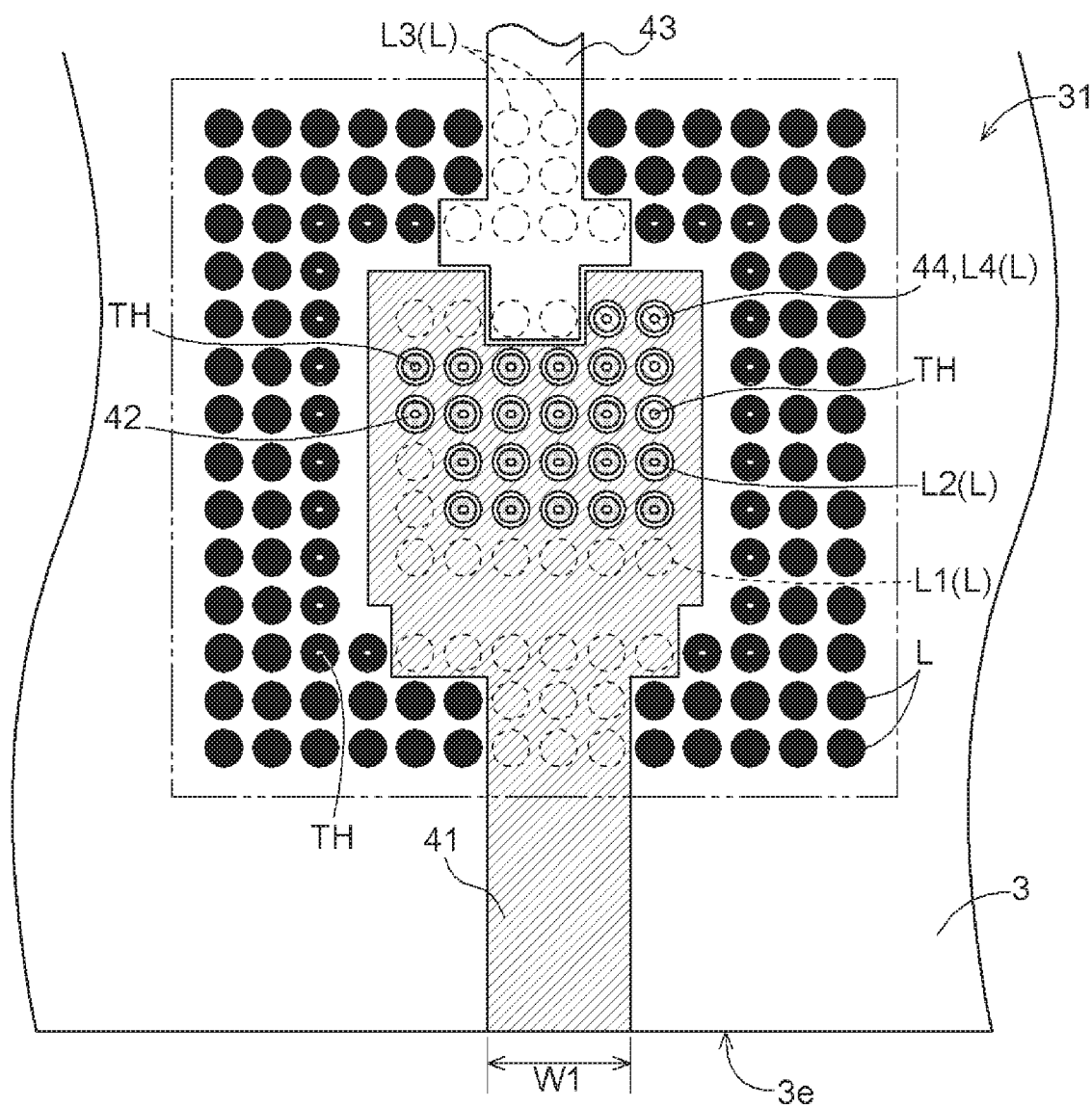
Fig.5
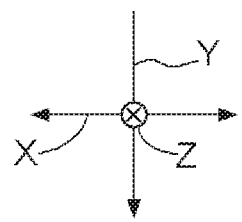

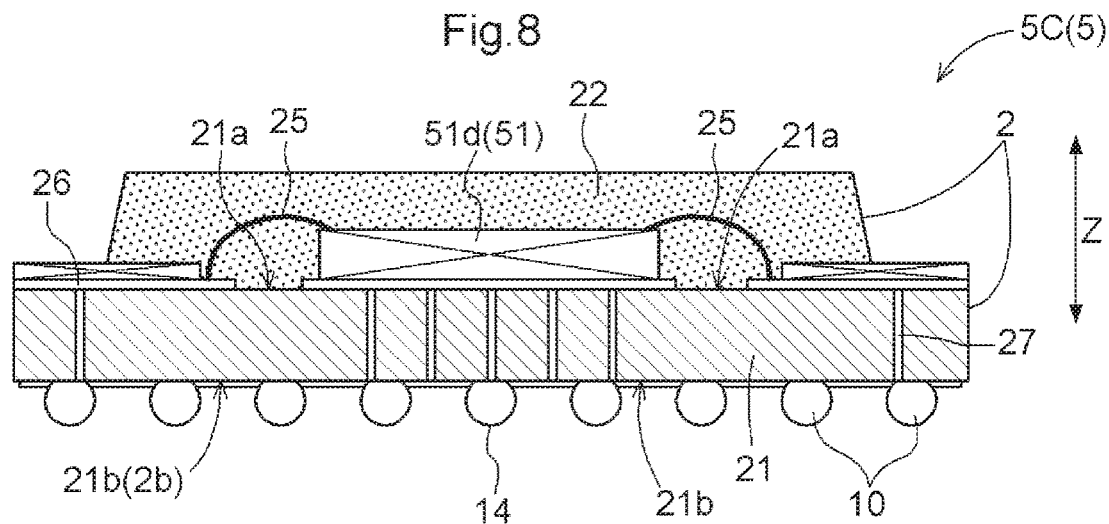
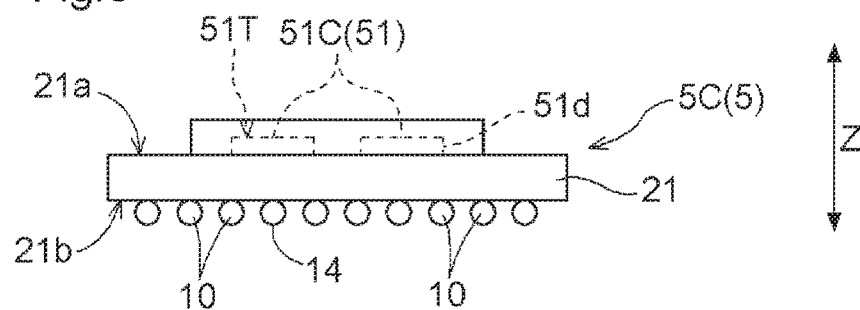
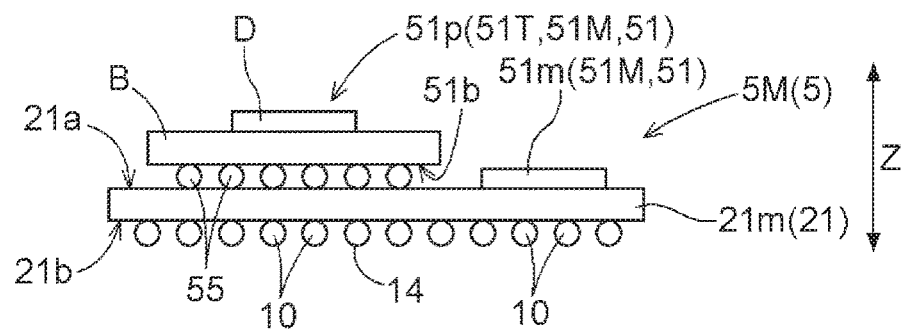
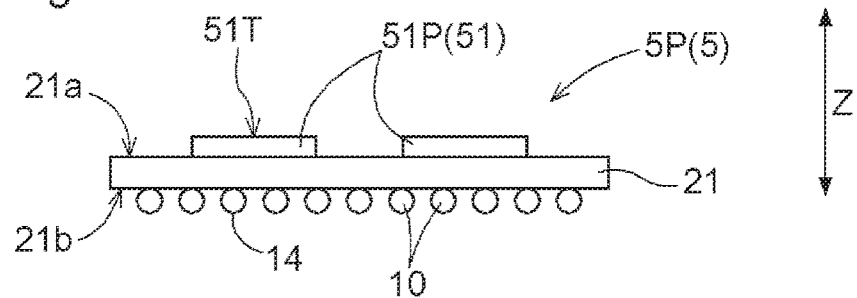

SEMICONDUCTOR DEVICE, CHIP MODULE, AND SEMICONDUCTOR MODULE

CROSS REFERENCE TO RELATED APPLICATIONS

This application is a National Stage of International Application No. PCT/JP2016/075578 filed Aug. 31, 2016, claiming priority based on Japanese Patent Application No. 2015-170409 filed Aug. 31, 2015, the contents of all of which are incorporated herein by reference in their entirety.

TECHNICAL FIELD

The present application relates to: a semiconductor device that includes a circuit substrate that has a plurality of wiring layers and through holes and a semiconductor module or a chip module; a chip module; and a semiconductor module.

BACKGROUND ART

Japanese Patent Application Publication No. 10-303562 (JP 10-303562 A) (Patent Document 1) discloses a technology of a circuit substrate that facilitates wiring and that enables stable power supply. In the case where a semiconductor module of a BGA (ball grid array) type with a multiplicity of connection terminals or the like is mounted on a circuit substrate, it is difficult to complete all wiring in only a wiring layer on a surface layer of the circuit substrate. Therefore, a circuit substrate on which such a semiconductor module is to be mounted generally has a plurality of wiring layers and through holes that connect between the plurality of wiring layers. Such a semiconductor module tends to consume much power, and it is desired that power supply wiring for supplying power should have a large wire width. In the document mentioned above, disconnection of the power supply wiring and a reduction in the area of the power supply wiring are suppressed with the power supply wiring around the through holes removed in order to keep insulation between the through holes for signal transfer and the power supply wiring. Specifically, stable power supply is enabled by securing sufficient width and area of the power supply wiring by avoiding connection of wiring-removed regions of the power supply wiring by arranging the through holes which penetrate the power supply wiring regularly. Since the through holes penetrate the power supply wiring, however, the effective area of the power supply wiring in the region occupied by the power supply wiring is reduced by an amount by which the wiring-removed regions which prevent conduction with the through holes are provided. Thus, there is desired a technique of providing power supply wiring that has a large effective area without being affected by the through holes.

RELATED-ART DOCUMENTS

Patent Documents

[Patent Document 1] Japanese Patent Application Publication No. 10-303562 (JP 10-303562 A)

SUMMARY OF THE APPLICATION

Problems in the Related Art

In view of the foregoing background, it is desirable to provide a technique that is capable of suppressing a decrease in the effective area of wiring due to through holes and enables stable power supply.

Means for Solving the Problem

One aspect provides a semiconductor device including:
a chip module that includes a module substrate in a rectangular plate shape, on an upper surface of which at least one semiconductor chip is supported and fixed, and a plurality of connection terminals disposed planarly along a lower surface of the module substrate and electrically connected to the semiconductor chip, the semiconductor chip including a package substrate and at least one semiconductor die supported by the package substrate; and
a main substrate which has a plurality of wiring layers and on which the chip module is surface-mounted via the plurality of connection terminals, the substrate being formed with a plurality of through holes that penetrate the substrate and that enable the plurality of wiring layers to be electrically connected to each other, in which:
the semiconductor chip has a plurality of chip terminals disposed planarly along a supported surface supported by the module substrate and electrically connected to the module substrate;
the plurality of chip terminals include a plurality of chip power supply terminals through which power is supplied to the semiconductor chip;
the plurality of chip power supply terminals are disposed on an inner side with respect to an outer edge of an arrangement region in which the plurality of chip terminals are disposed planarly;
the chip module is configured such that the semiconductor chip is mounted on the module substrate, and an arrangement of the plurality of chip terminals and an arrangement of the plurality of connection terminals are changed in the module substrate;
the plurality of connection terminals are arranged in a plurality of rectangular rings along sides of the module substrate, and the plurality of connection terminals include an inner peripheral-side terminal group arranged on a center side of the module substrate and an outer peripheral-side terminal group arranged on an outer peripheral side with respect to the inner peripheral-side terminal group;
the inner peripheral-side terminal group includes an inner peripheral-side power supply terminal group through which power is supplied to the semiconductor chip;
the outer peripheral-side terminal group includes an outer peripheral-side power supply terminal group of the same system as at least a part of the inner peripheral-side power supply terminal group;
the inner peripheral-side power supply terminal group is disposed at a position at which at least a part of the inner peripheral-side power supply terminal group overlaps the semiconductor chip as seen in a direction that is orthogonal to a plate surface of the module substrate;
the outer peripheral-side power supply terminal group is arranged so as to be continuous from the inner peripheral-side power supply terminal group to an outermost peripheral terminal of the outer peripheral-side terminal group;

the main substrate has a surface layer power supply path, through which power is supplied to the semiconductor chip via the inner peripheral-side power supply terminal group and the outer peripheral-side power supply terminal group, in a surface layer wiring layer on which the chip module is mounted; and the surface layer power supply path overlaps the inner peripheral-side power supply terminal group and the outer peripheral-side power supply terminal group as seen in an orthogonal direction that is orthogonal to a substrate surface of the main substrate with the chip module mounted on the main substrate, and is formed continuously so as to extend from a position at which the surface layer power supply path is connected to the inner peripheral-side power supply terminal group toward an outer peripheral side of the main substrate.

Another aspect provides a chip module that includes a module substrate in a rectangular plate shape, on an upper surface of which at least one semiconductor chip is supported and fixed, and a plurality of connection terminals disposed planarly along a lower surface of the module substrate and electrically connected to the semiconductor chip, the semiconductor chip including a package substrate and at least one semiconductor die supported by the package substrate, in which:

the semiconductor chip has a plurality of chip terminals disposed planarly along a supported surface supported by the module substrate and electrically connected to the module substrate;

the plurality of chip terminals include a plurality of chip power supply terminals through which power is supplied to the semiconductor chip;

the plurality of chip power supply terminals are disposed on an inner side with respect to an outer edge of an arrangement region in which the plurality of chip terminals are disposed planarly;

the semiconductor chip is mounted on the module substrate;

an arrangement of the plurality of chip terminals and an arrangement of the plurality of connection terminals are changed in the module substrate;

the plurality of connection terminals are arranged in a plurality of rectangular rings along sides of the module substrate, and the plurality of connection terminals include an inner peripheral-side terminal group arranged on a center side of the module substrate and an outer peripheral-side terminal group arranged on an outer peripheral side with respect to the inner peripheral-side terminal group;

the inner peripheral-side terminal group includes an inner peripheral-side power supply terminal group connected to a power supply terminal of the semiconductor chip;

the outer peripheral-side terminal group includes an outer peripheral-side power supply terminal group of the same system as at least a part of the inner peripheral-side power supply terminal group;

the inner peripheral-side power supply terminal group is disposed at a position at which at least a part of the inner peripheral-side power supply terminal group overlaps the semiconductor chip as seen in a direction that is orthogonal to a plate surface of the module substrate; and the outer peripheral-side power supply terminal group is arranged so as to be continuous from the inner peripheral-side power supply terminal group to an outermost peripheral terminal of the outer peripheral-side terminal group.

In the configuration described above, the inner peripheral-side power supply terminal group is disposed at a position at which at least a part of the inner peripheral-side power supply terminal group overlaps the semiconductor chip as seen in a direction that is orthogonal to a plate surface of the module substrate, and thus the inner peripheral-side power supply terminal group is disposed directly below the semiconductor chip. Thus, the power supply terminals of the semiconductor chip and the power supply terminals of the chip module can be connected to each other over a short wiring distance, which suppresses the impedance of the wiring to be low. In order to form a short power supply path for the semiconductor die, the chip power supply terminals are generally provided directly below the semiconductor die (in general, the module substrate and the package substrate are disposed in parallel with each other, and thus the chip power supply terminals are provided at positions at which the chip power supply terminals overlap at least a part of the semiconductor die as seen in a direction that is orthogonal to the plate surface of the module substrate (package substrate)). Thus, the inner peripheral-side power supply terminal group can also be considered as being disposed at a position at which at least a part of the inner peripheral-side power supply terminal group overlaps the semiconductor die as seen in a direction that is orthogonal to the plate surface of the module substrate.

In the semiconductor device, the surface layer power supply path through which power is supplied to the semiconductor chip is formed in the surface layer wiring layer on which the chip module is mounted. The surface layer power supply path overlaps the inner peripheral-side power supply terminal group and the outer peripheral-side power supply terminal group, through which power is supplied to the semiconductor chip via the module substrate, as seen in the orthogonal direction. Thus, the inner peripheral-side power supply terminal group and the outer peripheral-side power supply terminal group of the chip module, which is surface-mounted on the surface layer wiring layer, are directly connected to the surface layer power supply path. There is no need to provide the surface layer power supply path with through holes through which other signals are to be led out, or with holes or an insulation region, and thus the impedance of the surface layer power supply path can also be suppressed to be low. With the configuration described above, in this way, a semiconductor device and a chip module that are capable of suppressing a decrease in the effective area of wiring due to through holes and enable stable power supply can be provided.

For example, in the case where the semiconductor chip is a processor such as a general-purpose microcomputer or DSP, the terminal arrangement (the terminal arrangement of the chip terminals) is decided by the semiconductor vendor. That is, the terminal arrangement is not suitable for device manufacturers that produce apparatuses utilizing such microcomputers and DSPs in many cases. It is not impossible to produce microcomputers and DSPs as dedicated products with a terminal arrangement that is suitable for the device manufacturers. However, it is not profitable and not realistic in consideration of the development cost for the dedicated products etc. In the chip module, the terminal arrangement can be changed using wiring on the module substrate, and thus the terminal arrangement of the connection terminals on the chip module can be made suitable for the device manufacturers. As a result, as discussed above, power can be supplied to the semiconductor chip through the surface layer power supply path which is formed in the surface layer wiring layer of the main substrate.

Still another aspect provides a semiconductor device including:

- a semiconductor module that includes a support substrate in a rectangular plate shape, on an upper surface of which one or more semiconductor elements are supported and fixed, and a plurality of connection terminals disposed planarly along a lower surface of the support substrate and electrically connected to the semiconductor elements; and
- a main substrate which has a plurality of wiring layers and on which the semiconductor module is surface-mounted via the plurality of connection terminals, the substrate being formed with a plurality of through holes that penetrate the substrate and that enable the plurality of wiring layers to be electrically connected to each other, in which
- the plurality of connection terminals are arranged in a plurality of rectangular rings along sides of the support substrate, and the plurality of connection terminals include an inner peripheral-side terminal group arranged on a center side of the support substrate and an outer peripheral-side terminal group arranged on an outer peripheral side with respect to the inner peripheral-side terminal group,
- the inner peripheral-side terminal group includes an inner peripheral-side power supply terminal group through which power is supplied to a target semiconductor element which is one of the semiconductor elements,
- the outer peripheral-side terminal group includes an outer peripheral-side power supply terminal group of the same system as at least a part of the inner peripheral-side power supply terminal group,
- the inner peripheral-side power supply terminal group is disposed at a position at which at least a part of the inner peripheral-side power supply terminal group overlaps the target semiconductor element as seen in a direction that is orthogonal to a plate surface of the support substrate,
- the outer peripheral-side power supply terminal group is arranged so as to be continuous from the inner peripheral-side power supply terminal group to an outermost peripheral terminal of the outer peripheral-side terminal group,
- the main substrate has a surface layer power supply path, through which power is supplied to the target semiconductor element via the inner peripheral-side power supply terminal group and the outer peripheral-side power supply terminal group, in a surface layer wiring layer on which the semiconductor module is mounted, and
- the surface layer power supply path overlaps the inner peripheral-side power supply terminal group and the outer peripheral-side power supply terminal group as seen in an orthogonal direction that is orthogonal to a substrate surface of the main substrate with the semiconductor module mounted on the main substrate, and is formed continuously so as to extend from a position at which the surface layer power supply path is connected to the inner peripheral-side power supply terminal group toward an outer peripheral side of the main substrate.

Yet another aspect provides a semiconductor module that includes a support substrate in a rectangular plate shape, on an upper surface of which one or more semiconductor elements are supported and fixed, and a plurality of connection terminals disposed planarly along a lower surface of the support substrate and electrically connected to the semiconductor elements, in which

- the plurality of connection terminals are arranged in a plurality of rectangular rings along sides of the support substrate, and the plurality of connection terminals include an inner peripheral-side terminal group arranged on a center side of the support substrate and an outer peripheral-side terminal group arranged on an outer peripheral side with respect to the inner peripheral-side terminal group,
- the inner peripheral-side terminal group includes an inner peripheral-side power supply terminal group connected to a power supply terminal of a target semiconductor element which is one of the semiconductor elements,
- the outer peripheral-side terminal group includes an outer peripheral-side power supply terminal group of the same system as at least a part of the inner peripheral-side power supply terminal group,
- the inner peripheral-side power supply terminal group is disposed at a position at which at least a part of the inner peripheral-side power supply terminal group overlaps the target semiconductor element as seen in a direction that is orthogonal to a plate surface of the support substrate, and
- the outer peripheral-side power supply terminal group is arranged so as to be continuous from the inner peripheral-side power supply terminal group to an outermost peripheral terminal of the outer peripheral-side terminal group.

In the configuration described above, the inner peripheral-side power supply terminal group is disposed at a position at which at least a part of the inner peripheral-side power supply terminal group overlaps the target semiconductor element as seen in a direction that is orthogonal to a plate surface of the support substrate, and thus the inner peripheral-side power supply terminal group is disposed directly below the target semiconductor element. Thus, the power supply terminals of the target semiconductor element and the power supply terminals of the semiconductor module can be connected to each other over a short wiring distance, which suppresses the impedance of the wiring to be low. In the semiconductor device, the surface layer power supply path through which power is supplied to the target semiconductor element is formed in the surface layer wiring layer on which the semiconductor module is mounted. The surface layer power supply path overlaps the inner peripheral-side power supply terminal group and the outer peripheral-side power supply terminal group, through which power is supplied to the target semiconductor element via the support substrate, as seen in the orthogonal direction. Thus, the inner peripheral-side power supply terminal group and the outer peripheral-side power supply terminal group of the semiconductor module, which is surface-mounted on the surface layer wiring layer, are directly connected to the surface layer power supply path. There is no need to provide the surface layer power supply path with through holes through which other signals are to be led out, or with holes or an insulation region, and thus the impedance of the surface layer power supply path can also be suppressed to be low. With the configuration described above, in this way, a semiconductor device and a semiconductor module that are capable of suppressing a decrease in the effective area of wiring due to through holes and enable stable power supply can be provided.

Further characteristics and advantages of the semiconductor device and the semiconductor module will become clear from the following description of an embodiment made with reference to the drawings.

BRIEF DESCRIPTION OF THE DRAWINGS

FIG. 3 schematically illustrates an example of a partial wiring pattern that includes power supply wiring in a surface layer wiring layer.

FIG. 5 schematically illustrates another example of a partial wiring pattern that includes power supply wiring in a surface layer wiring layer.

FIG. 8 is a sectional view illustrating the structure of a semiconductor module (SOC).

FIG. 9 is a schematic sectional view illustrating the structure of the semiconductor module (SOC).

FIG. 10 is a schematic sectional view illustrating the structure of a semiconductor module (MCM).

FIG. 11 is a schematic sectional view illustrating the structure of a semiconductor module (SIP).

PREFERRED EMBODIMENTS

Figure 1:
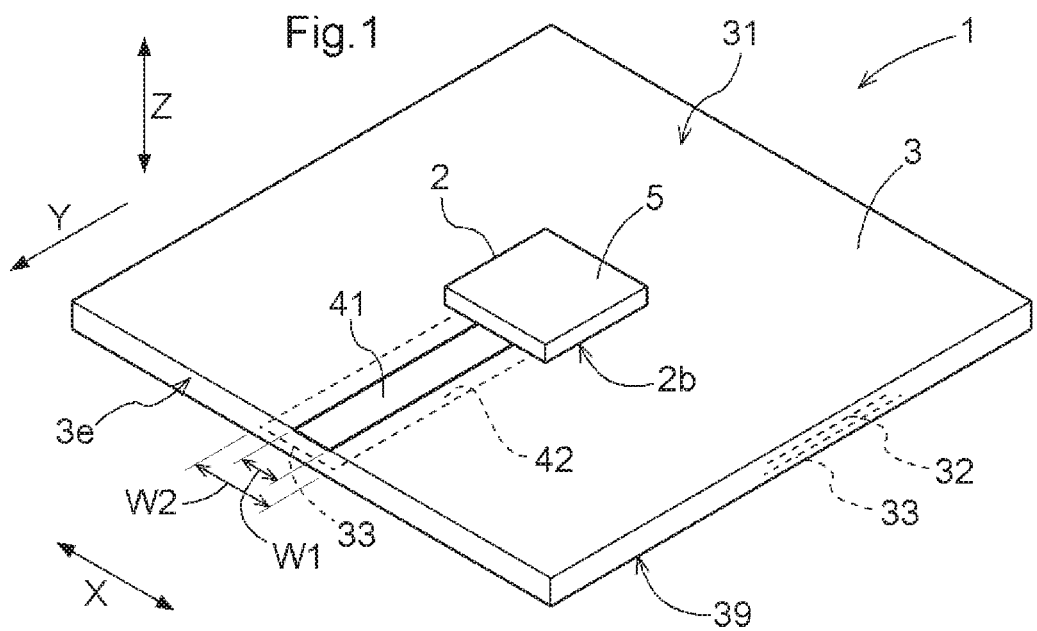
FIG. 1 schematically illustrates the appearance of a semiconductor device.

A semiconductor module and a semiconductor device according to an embodiment will be described below with reference to the drawings. As illustrated in FIG. 1, a semiconductor device 1 includes a circuit substrate 3 (main substrate) with a plurality of layers (31, 32, 33, 39) that have wiring layers in surface and inner layers and a semiconductor module 5 mounted on the circuit substrate 3. As illustrated in FIGS. 8 to 11, for example, the semiconductor module 5 is configured to include at least one semiconductor element 51 and a support substrate 21, on an upper surface 21a of which the semiconductor element 51 is supported and fixed. A plurality of terminals 10 (connection terminals) electrically connected to the semiconductor element 51 are disposed planarly on a lower surface 21b of the support substrate 21 to project from the lower surface 21b.

FIG. 8 schematically illustrates a general structure of the semiconductor module 5 (system LSI 5C) which is configured to include a single semiconductor element 51 (semiconductor die 51d). FIG. 9 schematically illustrates the structure of the semiconductor module 5 (system LSI (SOC (System on a Chip) 5C)) in which a plurality of semiconductor elements 51 (semiconductor dies 51d) are sealed in one package. The semiconductor dies 51d are supported and fixed to the upper surface 21a of the support substrate 21 (package substrate). Reference numeral "51C" denotes semiconductor elements 51 in the system LSI 5C. The system LSI 5C may be configured as an LSI (Large Scale Integration Circuit) in which a plurality of circuit blocks (mega cells) that have a peculiar function on a single semiconductor element 51 (semiconductor die 51d) also in the case where the semiconductor module 5 is configured to include a single semiconductor element 51 (semiconductor die 51d).

FIG. 10 illustrates an embodiment in which the semiconductor module 5 is configured as a hybrid IC referred to as a multi-chip module 5M (MCM (Multi Chip Module)). The multi-chip module 5M (chip module) is configured as a module in which at least one of a plurality of semiconductor elements 51 (such as a semiconductor chip denoted by reference numeral "51M") that have a peculiar function is mounted on one support substrate 21 (module substrate 21m). That is, the multi-chip module 5M (chip module) includes: a module substrate 21m (support substrate 21) in a rectangular plate shape, on the upper surface of which at least one semiconductor chip 51M (semiconductor element 51) is supported and fixed, the semiconductor chip 51M including a package substrate B and at least one semiconductor die D supported by the package substrate B; and a plurality of terminals 10 disposed planarly along the lower surface 21b of the module substrate 21m and electrically connected to the semiconductor chip 51M. The multi-chip module 5M may be configured to have one semiconductor chip 51M.

FIG. 10 illustrates an embodiment in which a processor 51p such as a microcomputer or a DSP (Digital Signal Processor) and a peripheral chip such as a memory 51m are mounted on the module substrate 21m (support substrate 21) as a plurality of semiconductor elements 51 (semiconductor chips 51M) that have a peculiar function, for example. In the case where the multi-chip module 5M (chip module) has a plurality of semiconductor chips 51M in this way, at least one of the semiconductor chips 51M with a characteristic positional relationship among chip power supply terminals 56 (see FIG. 17 etc.), an inner peripheral-side power supply terminal group (141g, 14g; see FIG. 16 etc.), surface layer power supply wire 40 (see FIG. 16 etc.), etc. is characteristic as discussed later is referred to as a "target semiconductor chip". As discussed above, the multi-chip module 5M (chip module) may be configured to have one semiconductor chip 51M. In this case, the one semiconductor chip 51M corresponds to the target semiconductor chip.

In the embodiment illustrated in FIG. 10, the processor 51*p* corresponds to the target semiconductor chip which is one of the semiconductor chips 51M. The target semiconductor chip (here, the processor 51*p*) has a plurality of chip terminals 55 disposed planarly along a supported surface 51*b* supported by the module substrate 21*m* and electrically connected to the module substrate 21*m*. As will be discussed later with reference to FIG. 17, the plurality of chip terminals 55 include the plurality of chip power supply terminals 56 through which power is supplied to the target semiconductor chip (here, the processor 51*p*).

FIG. 11 illustrates an embodiment in which the semiconductor module 5 is configured as a hybrid IC referred to as a SIP (System in a Package) 5P. The semiconductor module 5 as the SIP 5P is configured as a hybrid IC in which a plurality of semiconductor elements 51 (such as semiconductor chips denoted by reference numeral "51P") that have a peculiar function are integrated in one package, for example.

Figure 17:
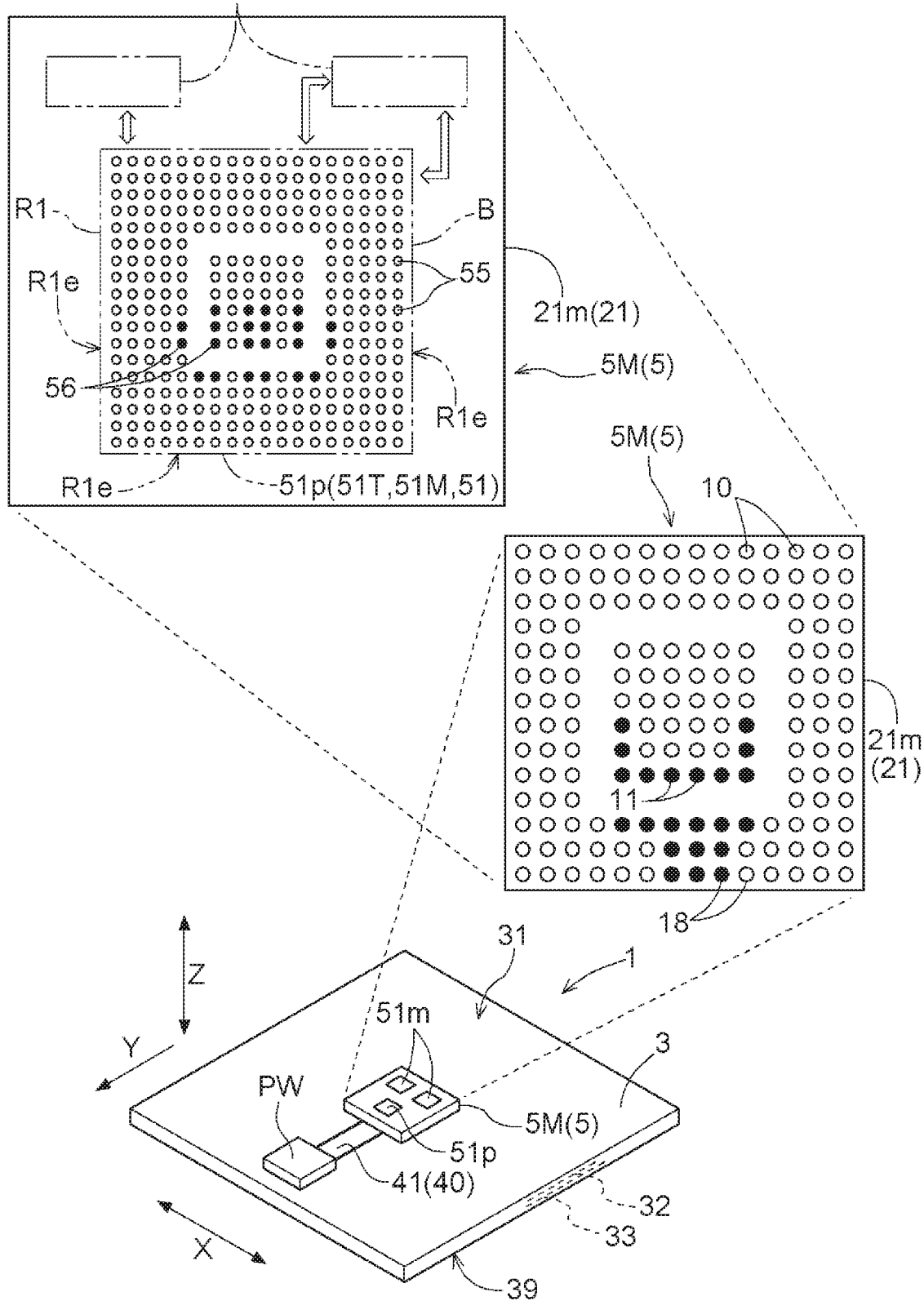
FIG. 17 illustrates the characteristic of the semiconductor device.

Although the semiconductor element 51 has a terminal arrangement corresponding to the semiconductor element 51, the terminal arrangement can be changed in the support substrate 21 (such as the module substrate 21*m* to be discussed later, for example). That is, the arrangement of the terminals 10 of the semiconductor module 5 can be set in the support substrate 21 so as to achieve a terminal arrangement that is suitable for being mounted to the circuit substrate 3. For example, in the case where the semiconductor element 51 (a target semiconductor element 51T to be discussed later) is the processor 51*p* such as a general-purpose microcomputer or DSP, the terminal arrangement (the terminal arrangement of the chip terminals 55) is decided by the semiconductor vendor. In the multi-chip module 5M which is an aspect of the semiconductor module 5, the terminal arrangement of the chip terminals 55, which are terminals of the processor 51*p* (corresponding to the target semiconductor element 51T), can be changed in the module substrate 21*m* (support substrate 21) to achieve a terminal arrangement that is appropriate as the terminals 10 (connection terminals) of the semiconductor module 5 (multi-chip module 5M). FIG. 17 is a perspective view illustrating the terminal arrangement of the processor 51*p* and the multi-chip module 5M, illustrating the lower surface of the processor 51*p* (the side having terminals) and the multi-chip module 5M as seen from the upper surface (the side with no terminals).

As illustrated in FIG. 17, the processor 51*p* (target semiconductor element 51T) has the plurality of chip terminals 55 which are disposed planarly along the supported surface 51*b* (see FIGS. 10 and 16) which is supported by the module substrate 21*m* (support substrate 21) and which are electrically connected to the support substrate 21. The plurality of chip terminals 55 are disposed in an arrangement region R1. The chip terminals 55 have the plurality of chip power supply terminals 56 through which power is supplied to the processor 51*p* and which are indicated as black dots in FIG. 17. The multi-chip module 5M includes the plurality of terminals 10 (connection terminals) which are disposed planarly along the lower surface 21*b* of the module substrate 21*m* (support substrate 21) and which are electrically connected to the processor 51*p*. Among the terminals 10, terminals indicated as black dots are power supply terminals (first power supply terminals 11 to be discussed later). The chip power supply terminals 56 of the processor 51*p* are disposed at positions at which power can be supplied appropriately to the semiconductor die D (see FIGS. 10 and 16) which is mounted on the processor 51*p*. As illustrated in FIG. 17, the chip power supply terminals 56 are disposed only on the inner side with respect to outer edges R1*e* of the arrangement region R1 (so as not to be continuous with the outer edges R1*e* of the arrangement region R1). However, the terminal arrangement is changed in the module substrate 21*m* (support substrate 21), and first power supply terminals 11 are arranged so as to be continuous with terminals at the outermost periphery (outermost peripheral terminals 18) on the multi-chip module 5M.

By connecting the plurality of semiconductor elements 51 on the support substrate 21, terminals connected only between the semiconductor elements 51 can be removed from the terminals 10 of the semiconductor module 5. The terminals 10 can be arranged more appropriately by reducing the total number of the terminals 10. For example, the multi-chip module 5M illustrated in FIGS. 10, 16, and 17 includes the processor 51*p* and the memory 51*m* as the semiconductor chips 51M (semiconductor elements 51) which constitute the semiconductor module 5. In many cases, the processor 51*p* is provided with terminals to be connected to the memory 51*m*. The processor 51*p* is provided with a large number of terminals to be connected to the memory 51*m*, since the terminals include those for bus signals such as an address bus and a data bus. When the processor 51*p* and the memory 51*m* are connected to each other on the module substrate 21*m* (support substrate 21), the terminals for such bus signals can be removed from the terminals 10 of the semiconductor module 5 (multi-chip module 5M). This facilitates changing the arrangement of the power supply terminals as discussed above, for example. In the case where the semiconductor device 1 is configured by mounting such a multi-chip module 5M on the circuit substrate 3, a power supply circuit PW also mounted on the circuit substrate 3 and the multi-chip module 5M can be connected to each other by the surface layer power supply wire 40 (first power supply wire 41) which is formed in a surface layer wiring layer (first surface layer wiring layer 31) as illustrated in FIG. 17. That is, the path from the power supply circuit PW to the semiconductor module 5 (multi-chip module 5M) is shortened, which achieves power supply in a low-impedance environment.

As discussed above, in the case where the semiconductor element 51 is a processor such as a general-purpose microcomputer or DSP, the terminal arrangement (the terminal arrangement of the chip terminals 55) is decided by the semiconductor vendor. That is, the terminal arrangement is not suitable for device manufacturers that produce apparatuses utilizing such microcomputers and DSPs in many cases. It is not impossible to produce microcomputers and DSPs as dedicated products with a terminal arrangement that is suitable for the device manufacturers. However, it is not profitable and not realistic in consideration of the development cost for the dedicated products etc. As discussed above, the terminal arrangement can be changed using wiring on the module substrate 21*m* (support substrate 21) in the multi-chip module 5M, and thus the terminal arrangement of the terminals 10 (connection terminals) in the semiconductor module 5 (multi-chip module 5M) can be made suitable for device manufacturers.

In the arrangement of the chip power supply terminals 56 of the processor 51*p* illustrated in FIG. 17, the chip power supply terminals 56 are disposed only on the inner side of the outer edges R1*e* of the arrangement region R1 for the chip terminals 55, and the chip power supply terminals 56 are not disposed so as to be continuous with the outer edges R1*e*. Therefore, in the case where the processor 51*p* is directly mounted on the circuit substrate 3, for example, the power supply circuit PW and the chip power supply terminals 56 cannot be connected to each other in the surface layer wiring layer (first surface layer wiring layer 31) of the circuit substrate 3. By changing the terminal arrangement in the module substrate 21m (support substrate 21), however, wiring (first power supply wire 41) for supplying power to the processor 51p can be formed in the surface layer wiring layer (first surface layer wiring layer 31) of the circuit substrate 3. That is, as discussed above, power can be supplied to the semiconductor element 51 (semiconductor chip 51M) through the surface layer power supply wire 40 which is formed in the surface layer wiring layer (first surface layer wiring layer 31) of the circuit substrate 3.

Figure 12:
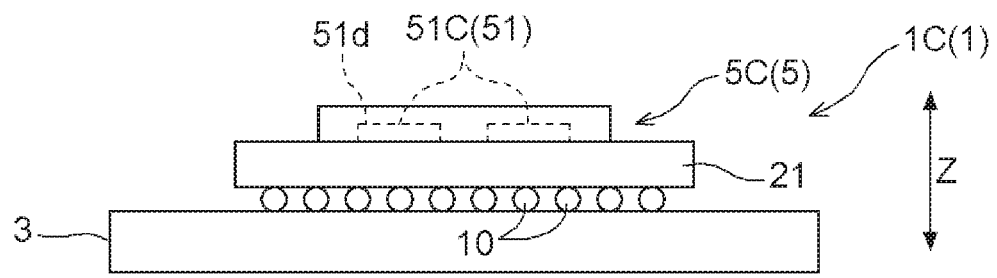
FIG. 12 is a schematic sectional view illustrating the structure of a semiconductor device that includes the SOC.
Figure 13:
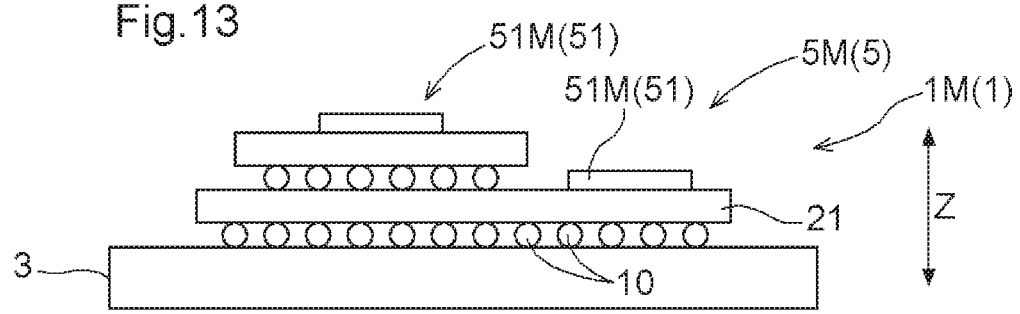
FIG. 13 is a schematic sectional view illustrating the structure of a semiconductor device that includes the MCM.
Figure 14:
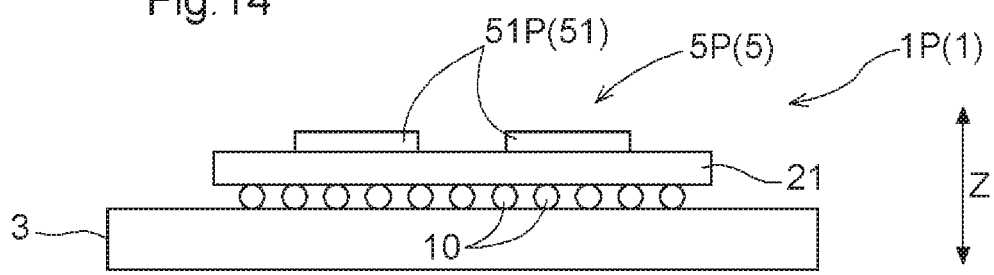
FIG. 14 is a schematic sectional view illustrating the structure of a semiconductor device that includes the SIP.

FIGS. 12 to 14 schematically illustrate examples of the configuration of the semiconductor device 1 which is configured by mounting the semiconductor module 5 illustrated in FIGS. 9 to 11 on the circuit substrate 3. FIG. 12 schematically illustrates an embodiment in which the semiconductor device 1 (1C) is configured by surface-mounting the system LSI 5C as the semiconductor module 5 on the circuit substrate 3. FIG. 13 schematically illustrates an embodiment in which the semiconductor device 1 (1M) is configured by surface-mounting the multi-chip module 5M as the semiconductor module 5 on the circuit substrate 3. FIG. 14 schematically illustrates an embodiment in which the semiconductor device 1 (1P) is configured by surface-mounting the SIP 5P as the semiconductor module 5 on the circuit substrate 3.

Figure 7:
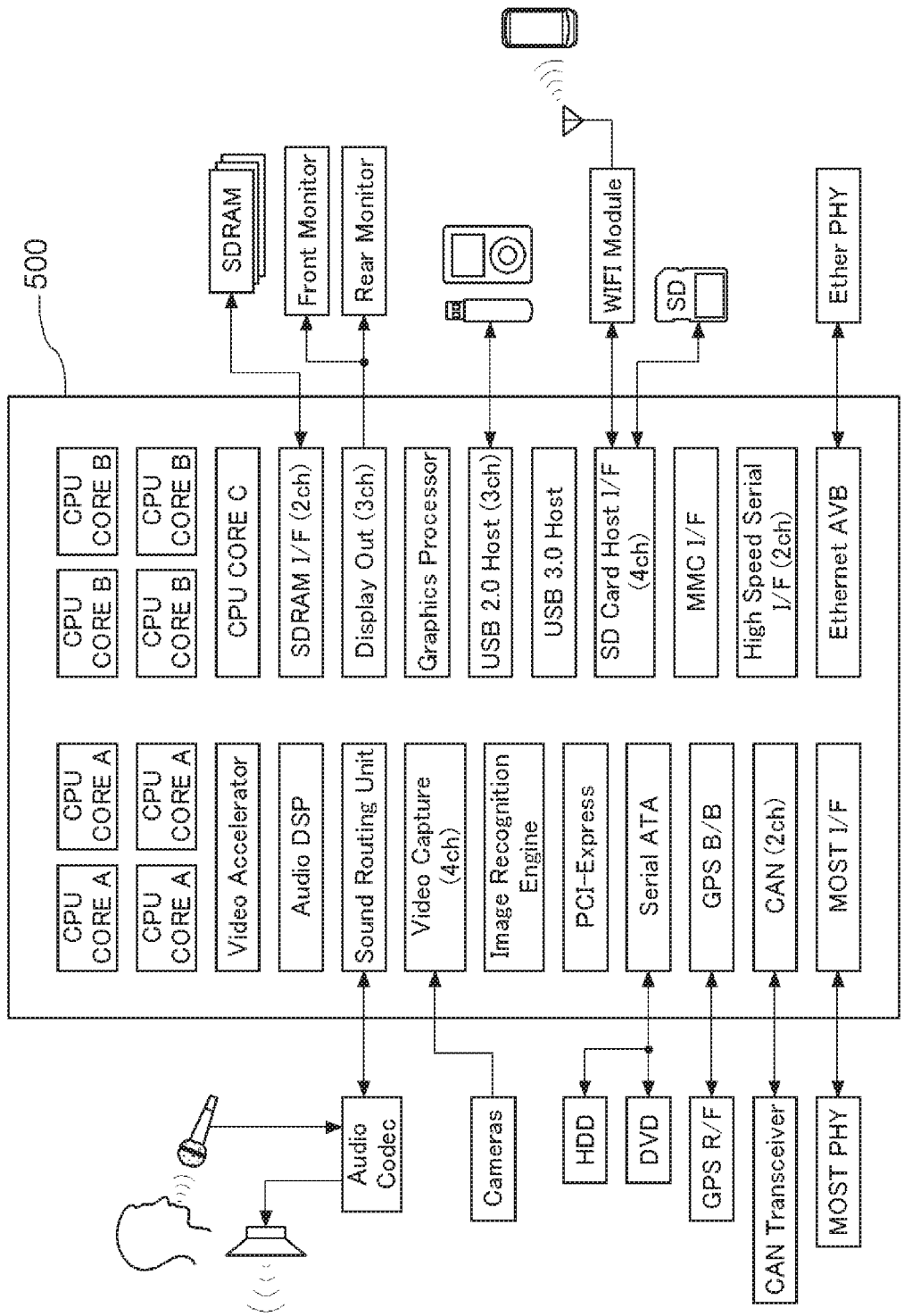
FIG. 7 is a functional block diagram illustrating an example of a system LSI.

The semiconductor device 1 according to an embodiment will be described in detail below. Here, an information processing device for an in-vehicle information apparatus to be mounted on a vehicle is described as an example of the semiconductor device 1. The semiconductor device 1 is configured as an ECU (electronic control unit) having the semiconductor module 5 as its core. In one aspect, as discussed above with reference to FIGS. 8 and 9, the semiconductor module 5 can be an in-vehicle information terminal SOC. An example of such an in-vehicle information terminal SOC is disclosed in a web page of a semiconductor vendor <http://japan.renesas.com/applications/automotive/cis/cis_highend/rcar_h2/index.jsp> [searched on Aug. 25, 2015]. FIG. 7 is a simplified reproduction of a block diagram illustrating the functional configuration of an in-vehicle information terminal SOC 500 illustrated on this web page. Mega cells such as nine CPU cores (four CPU COREs A, four CPU COREs B, and one CPU CORE C), a graphics processor, and an image recognition engine are integrated in the in-vehicle information terminal SOC 500. A plurality of such mega cells are integrated in the semiconductor module 5 according to the embodiment, although not illustrated. The mega cells such as CPU cores, graphics processors, and image recognition engines often perform complicated computations at a high speed (at a high clock frequency), and consume much power (a large consumption current flows therethrough).

As discussed above, FIG. 8 is a sectional view schematically illustrating a general structure of the semiconductor module 5 which is configured to include a single semiconductor element 51 (semiconductor die 51d). The semiconductor module 5 includes the semiconductor element 51 (semiconductor die 51d), the support substrate 21 (module substrate), bonding wires 25, electrode patterns 26, and a mold portion 22. The semiconductor element 51 is mounted on the upper surface 21a (component mount surface), which is a surface of the support substrate 21 on one side. The electrode patterns 26 corresponding to electrode pads (not illustrated) formed on the semiconductor element 51 are formed on the upper surface 21a. The electrode pads and the electrode patterns 26 are electrically connected to each other by the bonding wires 25. The electrode patterns 26 are electrically connected to the lower surface 21b (terminal surface), which is on the opposite side from the upper surface 21a, via through holes 27. Spherical bumps that serve as the terminals 10 (connection terminals) of the semiconductor module 5 are formed on the lower surface 21b so as to be electrically connected to the electrode patterns 26.

The semiconductor element 51 and the bonding wires 25 are molded with a resin material, for example. In the semiconductor module 5 illustrated in FIG. 2, the support substrate 21 and the mold portion 22 correspond to a package 2 that houses the semiconductor element 51. As discussed above, ball-shaped terminals (spherical bumps) are projected to form the terminals 10 on the lower surface 21b of the support substrate 21, that is, a back surface 2b of the package 2, which forms a semiconductor module 5 of a BGA (Ball Grid Array) type. The semiconductor modules 5 (5C, 5M, 5P) illustrated in FIGS. 9 to 11 are also semiconductor modules 5 of the BGA type.

Figure 2:
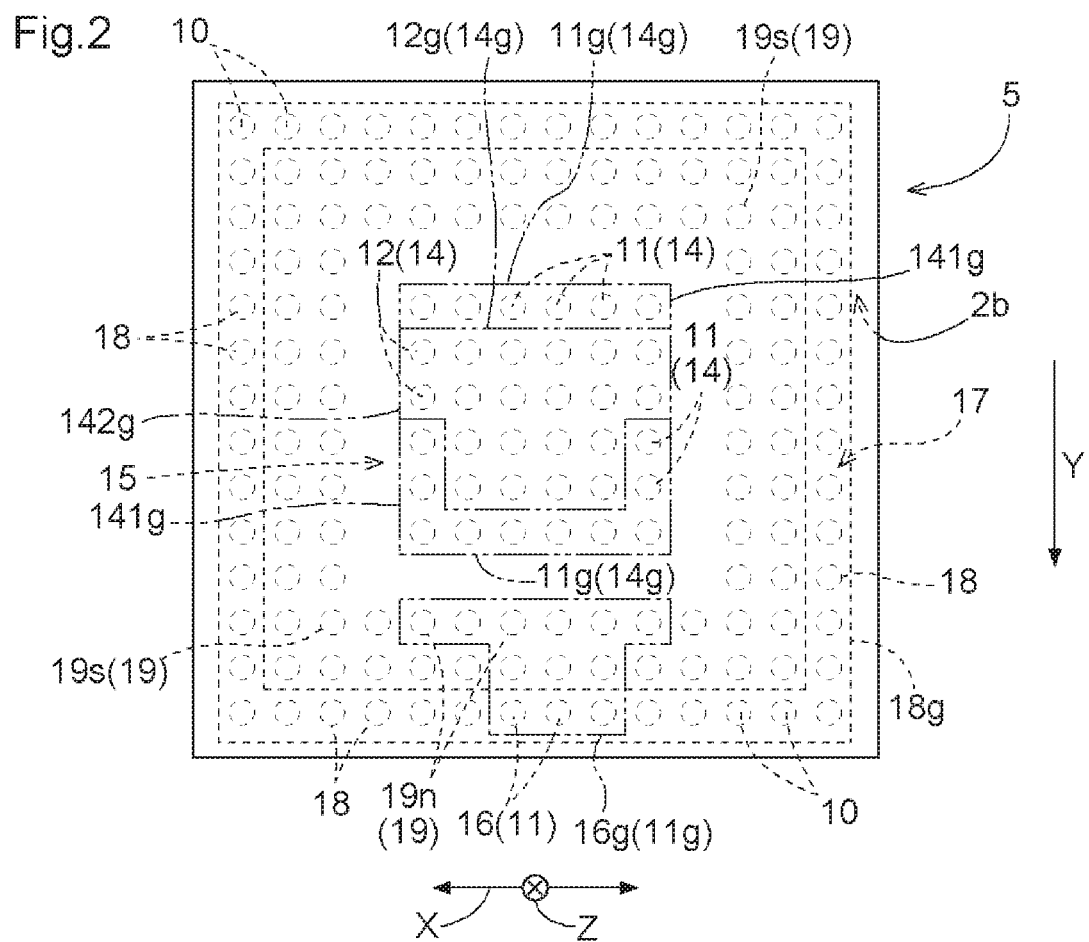
FIG. 2 is a schematic perspective view illustrating an example of the terminal arrangement of a semiconductor module.

FIG. 2 is a perspective view schematically illustrating the lower surface of the semiconductor module 5 (the lower surface 21b of the support substrate 21; the back surface 2b of the package 2) as seen from the side of the upper surface (the upper surface 21a of the support substrate 21). In FIG. 2, the circles in broken lines indicate the terminals 10. The number, size, intervals, etc. of the terminals 10 are schematic. The terminals 10 are arranged in a plurality of rectangular rings along the sides of the support substrate 21. In the embodiment, the terminals 10 are constituted of an inner peripheral-side terminal group 15 arranged in a rectangular shape at the center portion of the package 2, and an outer peripheral-side terminal group 17 arranged on the outer peripheral side with respect to the inner peripheral-side terminal group 15. The terminals 10 which are connected to power supply electrode pads of the semiconductor element 51 are mainly assigned to the inner peripheral-side terminal group 15.

The inner peripheral-side terminal group 15 has the terminals 10 even at the center portion, and does not have a clearance at the center portion. It can be considered, however, that in the inner peripheral-side terminal group 15 which has 36 terminals 10 in FIG. 2, four terminals 10 at the center portion, 20 terminals 10 at the outermost periphery, and twelve terminals therebetween are respectively arranged in a rectangular ring (arranged in three rectangular rings). Thus, it can be considered that the terminals 10 are arranged in rectangular rings even in the case where the terminals 10 are densely spread as with the inner peripheral-side terminal group 15 illustrated in FIG. 2.

The inner peripheral-side terminal group 15 is disposed substantially directly below the semiconductor element 51 (at a position at which at least a part of the inner peripheral-side terminal group 15 overlaps the semiconductor element 51 as seen in a direction that is orthogonal to the plate surface of the support substrate 21 (support substrate orthogonal direction)). With the semiconductor module 5 mounted on the circuit substrate 3 (main substrate), the direction orthogonal to the substrate surface of the circuit substrate 3 (orthogonal direction Z; see FIGS. 12 to 14 etc., for example) is substantially synonymous with the support substrate orthogonal direction if component tolerances and mounting errors are ignored. Thus, unless otherwise noted, the term "orthogonal direction Z" as used herein and in the drawings is commonly understood as the support substrate orthogonal direction and the direction which is orthogonal to the substrate surface of the circuit substrate 3.

Power can be supplied to the semiconductor element 51 with the effect of the electrical resistance and the inductance reduced to as little as possible when the inner peripheral-side terminal group 15 is disposed substantially directly below the semiconductor element 51 and power supply terminals are assigned to the inner peripheral-side terminal group 15. As illustrated in FIGS. 9, 10, and 11, in the case where the semiconductor module 5 has a plurality of semiconductor elements 51, the inner peripheral-side terminal group 15 is disposed directly below the semiconductor element 51 (target semiconductor element 51T) to which power is supplied via the inner peripheral-side terminal group 15.

Signal terminals to be connected to an in-vehicle information terminal (such as a monitor device, a camera, and a disk device) are mainly assigned to the outer peripheral-side terminal group 17. In order to lead out signal lines from the inner peripheral-side terminal group 15 to the outside of the semiconductor module 5 in the surface layer wiring layer not via through holes, it is necessary that signal wires should pass between the terminals 10 of the outer peripheral-side terminal group 17. Depending on the number of signals, however, it is occasionally difficult for signal wires to pass between the terminals 10 of the outer peripheral-side terminal group 17. Thus, the signal terminals are preferably assigned to the outer peripheral-side terminal group 17 which is disposed more toward the outer peripheral side.

Figure 15:
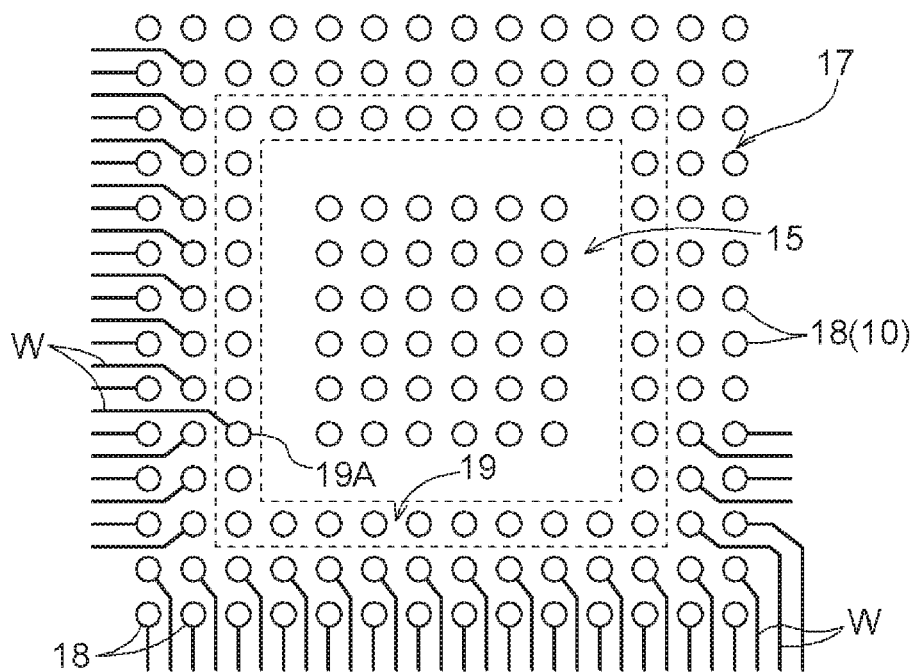
FIG. 15 illustrates an example of the relationship between the terminal arrangement of a semiconductor module and wiring on a circuit substrate.

In reality, the number of the signal wires that can pass between a terminal 10 and a terminal 10 is limited, and differs in accordance with the pitch of the terminals 10 (distance between the terminals), the width of the signal wires that can be formed on the circuit substrate 3, the required insulation distance between the signal wires, etc. Here, in order to facilitate understanding, it is assumed that one signal wire can pass between a terminal 10 and a terminal 10. As with FIG. 2, FIG. 15 is a perspective view schematically illustrating the lower surface of the semiconductor module 5 (the lower surface 21b of the support substrate 21; the back surface 2b of the package 2) as seen from the side of the upper surface (the upper surface 21a of the support substrate 21). In FIG. 15, reference symbol "W" schematically denotes signal wires led out from the terminals 10 on the circuit substrate 3 on which the semiconductor module 5 is mounted. In FIGS. 2 and 15, the terminals 10 denoted by reference numeral "18" are outermost peripheral terminals disposed on the outermost peripheral side.

As illustrated in FIG. 15, the signal wires W can be freely led out from the outermost peripheral terminals 18 toward the outer peripheral side with respect to such terminals, since there are no terminals 10 on the outer peripheral side with respect to such terminals (outermost peripheral terminals 18). The signal wires W can be led out from the terminals 10 one round inward with respect to the outermost peripheral terminals 18 toward the outer peripheral side with respect to such terminals between the outermost peripheral terminals 18, since there is one round of terminals 10 on the outer peripheral side with respect to such terminals. When only one signal wire can pass between a terminal 10 and a terminal 10, the signal wires W cannot be led out from the terminals 10 located one more round inward toward the outer peripheral side with respect to such terminals between the terminals 10 on the outer peripheral side with respect to such terminals in many cases.

That is, whether or not the signal wires W can be led out toward the outer peripheral side with respect to terminals depends on the state of the signal wires W which are led out from the terminals 10 which are arranged on the outer peripheral side with respect to such terminals. In other words, in the example illustrated in FIGS. 2 and 15, terminals 10 disposed on the innermost peripheral side, of the outer peripheral-side terminal group 17, can be referred to as difficult connection terminals 19, from which the signal wires W cannot be easily led out toward the outer peripheral side with respect to such terminals through only the first surface layer wiring layer 31. The signal wires W cannot be led out from many of the difficult connection terminals 19 illustrated in FIG. 15 toward the outer peripheral side with respect to such terminals. However, the signal wire W can be led out from the difficult connection terminal 19 denoted by reference numeral "19A" toward the outer peripheral side with respect to such a terminal. From the above, the difficult connection terminals 19 are terminals 10, of the terminals 10 included in the outer peripheral-side terminal group 17, disposed at positions at which the signal wires W can occasionally be led out toward the outer peripheral side with respect to the outermost peripheral terminals 18 only by way of through holes TH depending on the presence or absence of the signal wires W which are led out from the terminals 10 disposed on the outer peripheral side with respect to such terminals, with the semiconductor module 5 mounted on the circuit substrate 3.

The difficult connection terminals 19 are preferably assigned to usage that does not require the signal wires W to be led out toward the outer peripheral side with respect to the outermost peripheral terminals 18. The difficult connection terminals 19 are preferably assigned to terminals for power supply, ground terminals, NC terminals through which a signal is not input or output and which are utilized to join the semiconductor module 5 to the circuit substrate 3 by soldering or the like, etc., for example. As discussed in detail later, lands denoted by reference symbol "L19" in FIG. 3 are lands to which the difficult connection terminals 19 illustrated in FIG. 2 are connected, for example. In the embodiment, the difficult connection terminals 19 are assigned to the terminals for power supply (outer peripheral-side power supply terminals 16 to be discussed later).

According to the web page mentioned above, the in-vehicle information terminal SOC 500 requires a plurality of power sources. Examples of such power sources include a power source (3.3 [V]/1.8 [V]) for input and output terminals, a power source (1.5 [V]/1.35 [V]) for a memory (indicated as "SDRAM I/F" in FIG. 7) that is capable of high-speed reading and writing, and a power source (1.0 [V]) for CPU cores (indicated as "CPU CORE A, CPU CORE B, CPU CORE C" in FIG. 7). The semiconductor module 5 occasionally requires two or so types of different power sources, if not so many as those described above. In the case where different types of CPU cores are mounted as in FIG. 7, a plurality of power sources are occasionally required depending on the difference in the consumption current (rated current), even if at the same voltage. In the embodiment, at least two types of power sources that have at least different rated current values are used. Therefore, the semiconductor module 5 includes the first power supply terminals 11 which are connected to one of the two types of power sources, and second power supply terminals 12 connected to the other.

A significantly large current flows through power supply terminals compared to signal terminals. Therefore, a plurality of terminals 10 are assigned to the power supply terminals. A collection of the terminals 10 which are assigned as the first power supply terminals 11 is referred to as a first power supply terminal group 11g. A collection of the terminals 10 which are assigned as the second power supply terminals 12 is referred to as a second power supply terminal group 12g.

As discussed above, the power supply terminals are basically assigned to the inner peripheral-side terminal group 15, and the signal terminals are basically assigned to the outer peripheral-side terminal group 17. In the embodiment, however, as illustrated in FIG. 2, the outer peripheral-side terminal group 17 also includes the power supply terminals (first power supply terminal group 11g). As discussed in detail later, the inner peripheral-side terminal group 15 includes the first power supply terminal group 11g (first inner peripheral-side power supply terminal group 141g) and the second power supply terminal group 12g (second inner peripheral-side power supply terminal group 142g). The first power supply terminals 11 and the second power supply terminals 12 in the inner peripheral-side terminal group 15 are collectively referred to as inner peripheral-side power supply terminals 14. A collection of the inner peripheral-side power supply terminals 14, that is, the first inner peripheral-side power supply terminal group 141g and the second inner peripheral-side power supply terminal group 142g, is collectively referred to as an inner peripheral-side power supply terminal group 14g.

As discussed above, the circuit substrate 3 has wiring layers in surface and inner layers. The wiring layers (31, 39) in the surface layers are wiring layers formed in the front surface and the back surface of the circuit substrate 3. The wiring layers (32, 33) in the inner layers are wiring layers formed in the inner surfaces of the circuit substrate 3. In the embodiment, as discussed later, different power supply wires (first power supply wire 41 (first power supply path), second power supply wire 42 (second power supply path)) are provided in the wiring layer (first surface layer wiring layer 31) in the surface layer and the wiring layer (second inner layer wiring layer 33) in the inner layer (see FIGS. 1 and 16).

Figure 20:
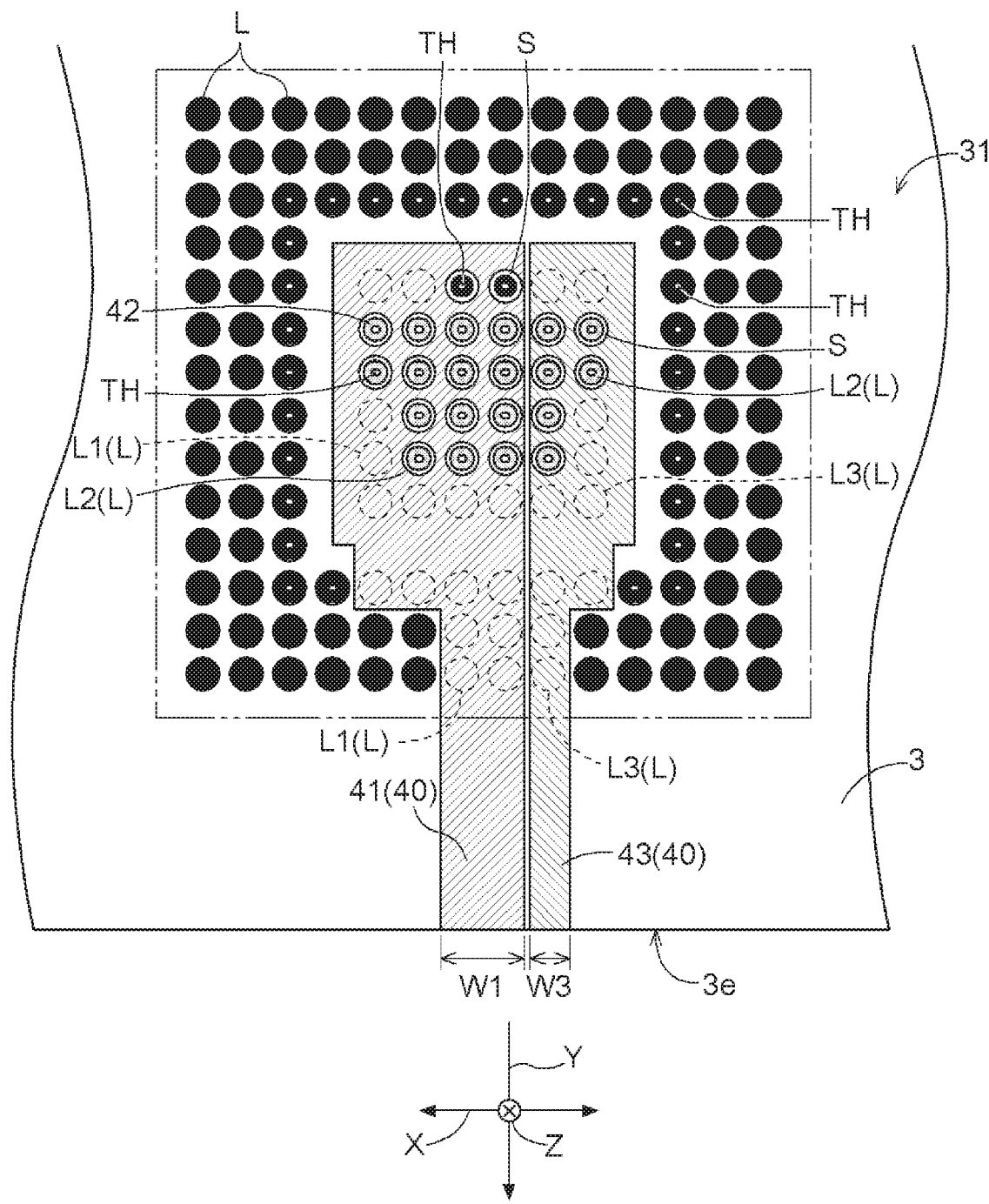
FIG. 20 schematically illustrates a different example of a partial wiring pattern that includes power supply wiring in a surface layer wiring layer.

FIG. 3 schematically illustrates a partial wiring pattern in one of the surface layers (31, 39) of the circuit substrate 3, that is, the first surface layer wiring layer 31 which is formed on a surface referred to as a component mount surface, a surface on the front side, a first surface, etc. Hereinafter, wiring patterns illustrated in FIGS. 3 to 6 and 20 are all seen from the side (first surface layer wiring layer 31) on which the semiconductor module 5 is mounted as with the wiring pattern in FIG. 2. FIG. 3 mainly illustrates electrode patterns and power supply wiring patterns in a portion contacted by the terminals 10 of the semiconductor module 5, and does not illustrate patterns of the signal wires W. The same applies to the wiring patterns illustrated in FIGS. 4 to 6 and 20. In FIGS. 3 and 20, reference symbol "L" denotes lands as the electrode patterns. In the first surface layer wiring layer 31, the terminals 10 are joined to the circuit substrate 3 by soldering in the lands L. Dots at the center of the lands L indicate the through holes TH which penetrate the circuit substrate 3 and which can electrically connect a plurality of different wiring layers to each other.

As discussed above with reference to FIG. 15, in the case where the signal wires W are led out from the terminals 10 on the inner peripheral side, of the outer peripheral-side terminal group 17, toward the outer side of the semiconductor module 5 in the first surface layer wiring layer 31, it is necessary that the signal wires W should pass between the lands L corresponding to the terminals 10 on the outer peripheral side with respect to such terminals. Therefore, the degree of freedom in the wiring path may be reduced or the noise resistance may be reduced even if the signal wires W can pass therebetween. Thus, in the embodiment, many of the terminals 10 (difficult connection terminals 19) on the innermost peripheral side, of the outer peripheral-side terminal group 17, are configured to be connected to the signal wires W which are provided in a wiring layer in an inner layer via the through holes TH. Lands L denoted by reference symbol "L19s" in FIG. 3 are lands connected to another wiring layer via the through holes TH, of difficult connection lands L19 to which the difficult connection terminals 19 are connected. Lands L denoted by reference symbol "L19n" in FIG. 3 are lands to which non-signal connection terminals to be discussed later are connected, of the difficult connection lands L19 to which the difficult connection terminals 19 are connected.

Of the lands L, "L1" denotes first power supply lands to be joined to the first power supply terminals 11, and "L2" denotes second power supply lands to be joined to the second power supply terminals 12. Lands L not particularly distinguished (lands L filled in black in FIGS. 3 to 6 and 20) are lands that are electrically connected to the signal terminals etc.

In the embodiment, as illustrated in FIG. 3, the first power supply wire 41 (first power supply path, surface layer power supply wire 40 (surface layer power supply path)) which connects between a portion of the first surface layer wiring layer 31 on the substrate outer peripheral edge 3e side (in the embodiment illustrated in FIG. 3, the substrate outer peripheral edge 3e is reached) and the first power supply terminals 11 of the semiconductor module 5 is disposed in the first surface layer wiring layer 31. The first power supply lands L1 are formed integrally with the first power supply wire 41. In FIG. 3 (and FIGS. 5 and 20), the first power supply wire 41 (surface layer power supply wire 40) and the first power supply lands L1 are illustrated as being provided continuously with each other. However, the wiring patterns may be partially omitted around the first power supply lands L1. If the first power supply wire 41 (surface layer power supply wire 40) and the first power supply lands L1 are continuous with each other, the temperature occasionally becomes lower than the fusing temperature of solder with heat escaping when mounting the semiconductor module 5. Therefore, a buffer region in a generally annular shape (an annular shape having radial bridge portions that are partially continuous with the first power supply lands L1 and the first power supply wire 41) may be provided around the first power supply lands L1.

In a region to which the inner peripheral-side terminal group 15 is connected, in particular, some of the lands L for signal terminals and the second power supply lands L2 are also disposed in the pattern of the first power supply wire 41. Therefore, annular insulation regions S are provided around (at the outer periphery of) the lands L for the signal terminals and around (at the outer periphery of) the second power supply lands L2 such that the first power supply wire 41 and the lands L for the signal terminals, and the first power supply wire 41 and the second power supply lands L2, are not continuous with each other.

Figure 4:
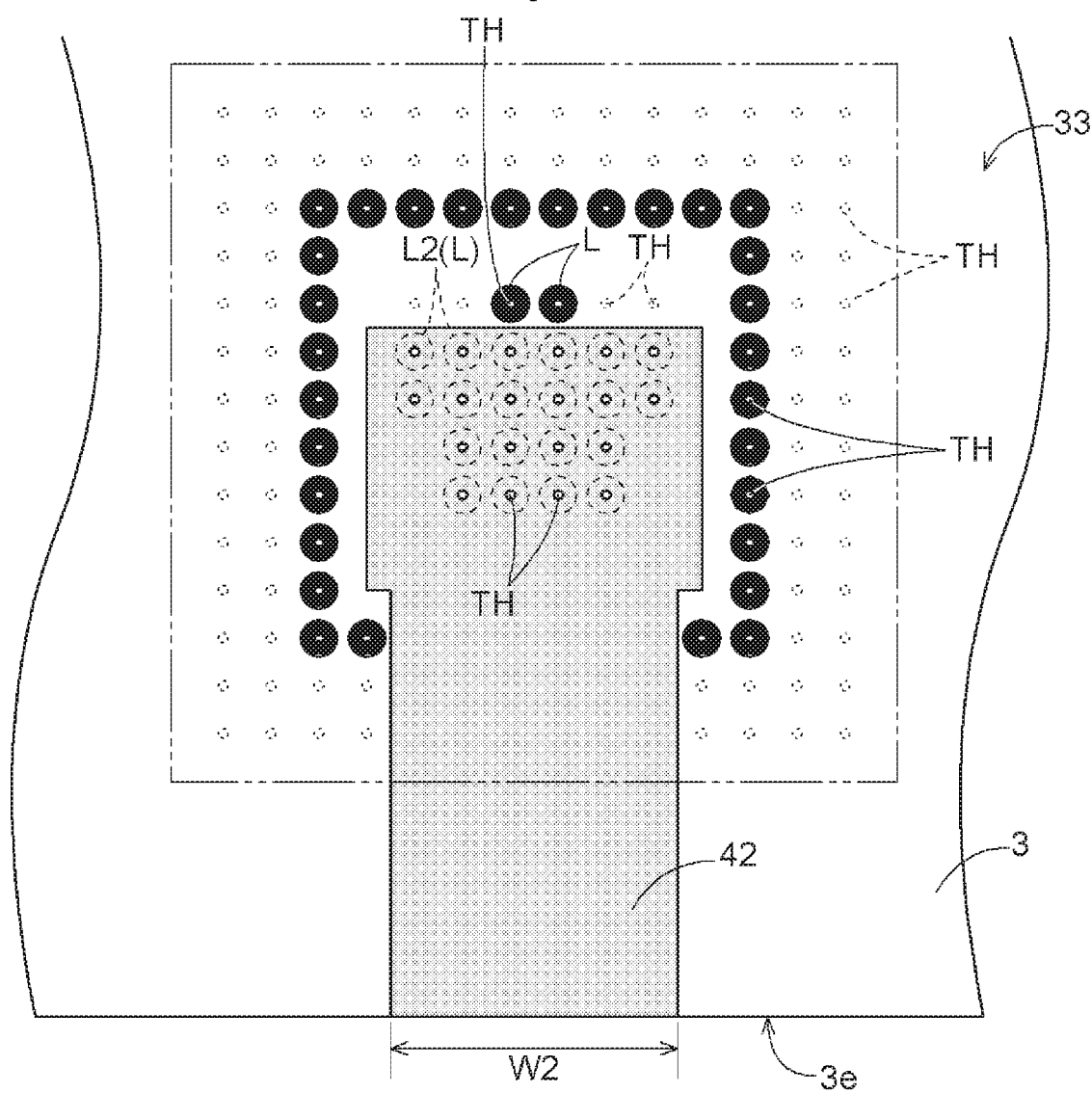
FIG. 4 schematically illustrates an example of a partial wiring pattern that includes power supply wiring in an inner layer wiring layer.

FIG. 4 schematically illustrates a partial wiring pattern in one of the inner layers (32, 33) of the circuit substrate 3, that is, the second inner layer wiring layer 33 with one inner layer wiring layer (first inner layer wiring layer 32) interposed between the first surface layer wiring layer 31 and the second inner layer wiring layer 33. In the embodiment, as illustrated in FIG. 4, the second power supply wire 42 (second power supply path) which connects between a portion of the second inner layer wiring layer 33 on the substrate outer peripheral edge 3e side (in the embodiment illustrated in FIG. 4, the substrate outer peripheral edge 3e is reached) and the second power supply terminals 12 of the semiconductor module 5 is disposed in the second inner layer wiring layer 33 separately from the first power supply wire 41. As discussed above, the signal wires W for the terminals 10 which are disposed on the outer side, of the outer peripheral-side terminal group 17, can be provided in the first surface layer wiring layer 31. However, the inner layer wiring layers may also have wiring patterns. The through holes TH (a portion corresponding to two rounds on the outer peripheral side) indicated by the broken lines in FIG. 4 indicate that the through holes TH may be formed in the case where wiring patterns are provided in the inner layer wiring layers.

As illustrated in FIGS. 3 and 4, the first power supply wire 41 and the second power supply wire 42 are each an integral band-like wiring pattern. The signal wires W to be connected to the terminals 10 are formed more easily in a surface layer wiring layer than in an inner layer wiring layer, since the signal wires W are connected to the terminals 10 in the first surface layer wiring layer 31. The power supply wiring has a band-like wiring pattern, and the width (W1) of the power supply wiring which is formed in a surface layer wiring layer is preferably smaller than the width (W2) of the power supply wiring which is formed in an inner layer wiring layer, since a larger region that can be utilized for wiring of other signal lines can be secured in the surface layer wiring layer (31). In the embodiment, the width (second power supply wire width W2) of the second power supply wire 42 in a width direction X (which generally coincides with the direction along the substrate outer peripheral edge 3e) is larger than the width (first power supply wire width W1) of the first power supply wire 41 in the same direction.

If the width of a wiring pattern can be increased, the cross-sectional area of the conductor is increased, which reduces the electrical resistance. Thus, it is preferable that a wiring pattern with a relatively large width correspond to a power supply terminal with a large rated current value. In the case of the embodiment, the second power supply terminal 12 preferably has a larger rated current value than that of the first power supply terminal 11. The inductance component of power supply wiring is increased in the case where the power supply wiring is formed in an inner layer wiring layer compared to the case where the power supply wiring is formed in the first surface layer wiring layer 31. If power supply wiring corresponding to a power supply terminal with a large rated current value is formed in the first surface layer wiring layer 31, however, it is necessary to increase the wire width, which increases the number of terminals 10, of the outer peripheral-side terminal group 17, that must be assigned to the power supply terminal and accordingly reduces the number of signal terminals. Thus, as in the embodiment, power supply wiring corresponding to a power supply terminal with the second largest rated current value or smaller, rather than power supply wiring corresponding to a power supply terminal with the largest rated current value, is preferably formed in the first surface layer wiring layer 31.

A power source has a positive electrode and a negative electrode, and currents flow in opposite directions through wiring on the positive electrode side and wiring on the negative electrode side. Therefore, if the wiring on the positive electrode side and the wiring on the negative electrode side are parallel to each other, electromagnetic waves generated when currents flow therethrough cancel out each other. In general, the negative electrode side of a power source is connected to the ground, and the ground acts as a shield by absorbing noise (electromagnetic waves) generated by fluctuations in signals that flow through signal lines. Therefore, a circuit substrate that has wiring in a plurality of layers including inner layer wiring layers is often provided with a wiring layer (so-called solid ground layer) in which a ground pattern is formed over a wide region. In the case where two types of power supply wiring (41, 42) are disposed in different wiring layers (31, 33) as in the embodiment, a ground layer is preferably provided in a wiring layer between such wiring layers (31, 33). In the case of the embodiment, a separate inner layer wiring layer (first inner layer wiring layer 32) in which a ground layer is formed is provided between the first surface layer wiring layer 31 in which the first power supply wire 41 is formed and one inner layer wiring layer (second inner layer wiring layer 33) in which the second power supply wire 42 is formed.

Figure 6:
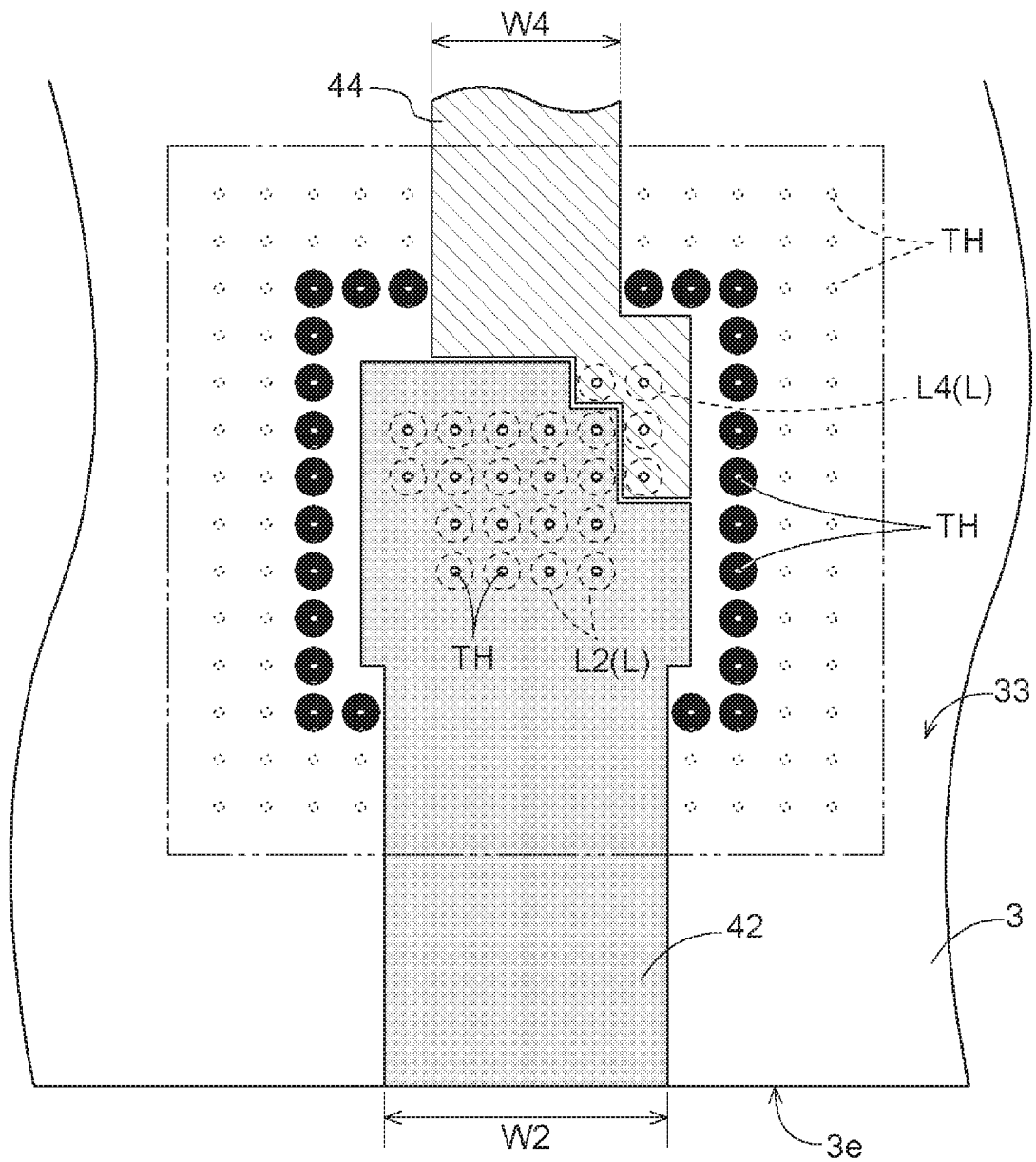
FIG. 6 schematically illustrates another example of a partial wiring pattern that includes power supply wiring in an inner layer wiring layer.

In the embodiment described above, two types of power sources with different rated current values are used. As a matter of course, however, three or more types of power sources may be used. FIGS. 5 and 6 illustrate an embodiment in which four types of power sources are used. A third power supply wire 43 and a fourth power supply wire 44 are provided as the power supply wiring, in addition to the first power supply wire 41 and the second power supply wire 42. Third power supply lands L3 that serve as lands to be connected to third power supply terminals (not illustrated) and fourth power supply lands L4 that serve as lands to be connected to fourth power supply terminals (not illustrated) are also provided.

Also in this example, power supply wiring (second power supply wire 42) connected to a power source with the largest rated current value, of the four types of power sources, is disposed in an inner layer wiring layer (second inner layer wiring layer 33). Power supply wiring (first power supply wire 41) connected to a power source with the second largest rated current value or smaller is disposed in a surface layer wiring layer (first surface layer wiring layer 31). The fourth power supply wire 44 which is connected to a power source with the larger rated current value, of the two remaining power sources, is disposed in the second inner layer wiring layer 33 for the same reason as the second power supply wire 42. The third power supply wire 43 which is connected to a power source with the smallest rated current value is disposed in the first surface layer wiring layer 31 as with the first power supply wire 41.

In the embodiment illustrated in FIGS. 5 and 6, the rated current value of the power source which is connected to the fourth power supply wire 44 is larger than the rated current value of the power source which is connected to the first power supply wire 41. Thus, the first power supply wire 41 is power supply wiring connected to a power source with the third largest rated current value. As a matter of course, the fourth power supply wire 44, rather than the first power supply wire 41, can be disposed in the first surface layer wiring layer 31. As is clear from FIGS. 5 and 6, however, the width (fourth power supply wire width W4) of the fourth power supply wire 44 is larger than the width (first power supply wire width W1) of the first power supply wire 41. In this embodiment, the first power supply wire 41 is disposed in the first surface layer wiring layer 31 from the viewpoint of securing sufficient lands L for signal terminals and signal wires in the first surface layer wiring layer 31.

In the embodiment described above, two or more types of power sources with different rated current values are used. As a matter of course, however, a single power source may be used. That is, in the embodiment described above, two power supply wires, namely the first power supply wire 41 which is formed in the first surface layer wiring layer 31 and the second power supply wire 42 which is formed in the second inner layer wiring layer 33, are provided. However, only the first power supply wire 41 (surface layer power supply wire 40) may be provided.

That is, the semiconductor device 1 which includes the semiconductor module 5 and the circuit substrate 3 (main substrate) is configured at least as described below. The semiconductor module 5 includes the support substrate 21 in a rectangular plate shape, on the upper surface 21a of which at least one semiconductor element 51 is supported and fixed, and the plurality of terminals 10 (connection terminals) which are disposed planarly along the lower surface 21b of the support substrate 21 and which are electrically connected to the semiconductor element 51. The circuit substrate 3 (main substrate) is a substrate which has the plurality of wiring layers (31, 32, 33, 39) and on which the semiconductor module 5 is surface-mounted via the plurality of terminals 10. The circuit substrate 3 is formed with the plurality of through holes TH which penetrate the substrate and which enable the plurality of wiring layers (31, 32, 33, 39) to be electrically connected to each other. The through holes TH are each formed at the same position in all of the plurality of wiring layers (31, 32, 33, 39). That is, the through holes TH penetrate along the orthogonal direction Z, and holes of the through holes TH all aligned along the orthogonal direction Z in the plurality of wiring layers (31, 32, 33, 39).

The plurality of terminals 10 are arranged in a plurality of rectangular rings along the sides of the support substrate 21. The plurality of terminals 10 include the inner peripheral-side terminal group 15 which is arranged on the center side of the support substrate 21, and the outer peripheral-side terminal group 17 which is arranged on the outer peripheral side with respect to the inner peripheral-side terminal group 15. The inner peripheral-side terminal group 15 includes the inner peripheral-side power supply terminal group 14g through which power is supplied to the target semiconductor element 51T which is one of the semiconductor elements 51. The outer peripheral-side terminal group 17 includes an outer peripheral-side power supply terminal group 16g of the same system as at least a part of the inner peripheral-side power supply terminal group 14g. The inner peripheral-side power supply terminal group 14g is disposed at a position at which at least a part of the inner peripheral-side power supply terminal group 14g overlaps the target semiconductor element 51T as seen in a direction that is orthogonal to the plate surface of the support substrate 21 (direction that is generally the same as the orthogonal direction Z). The outer peripheral-side power supply terminal group 16g is arranged so as to be continuous from the inner peripheral-side power supply terminal group 14g to the outermost peripheral terminals 18 of the outer peripheral-side terminal group 17.

The circuit substrate 3 has the surface layer power supply wire 40 (surface layer power supply path), through which power is supplied to the target semiconductor element 51T via the inner peripheral-side power supply terminal group 14g and the outer peripheral-side power supply terminal group 16g, in the surface layer wiring layer (first surface layer wiring layer 31) on which the semiconductor module 5 is mounted. The surface layer power supply wire 40 overlaps the inner peripheral-side power supply terminal group 14g and the outer peripheral-side power supply terminal group 16g as seen in the orthogonal direction Z which is orthogonal to the substrate surface of the circuit substrate with the semiconductor module 5 mounted on the circuit substrate 3, and is formed continuously so as to extend from a position at which the surface layer power supply wire 40 is connected to the inner peripheral-side power supply terminal group 14g toward the outer peripheral side of the circuit substrate 3 (toward the substrate outer peripheral edge 3e).

Figure 16:
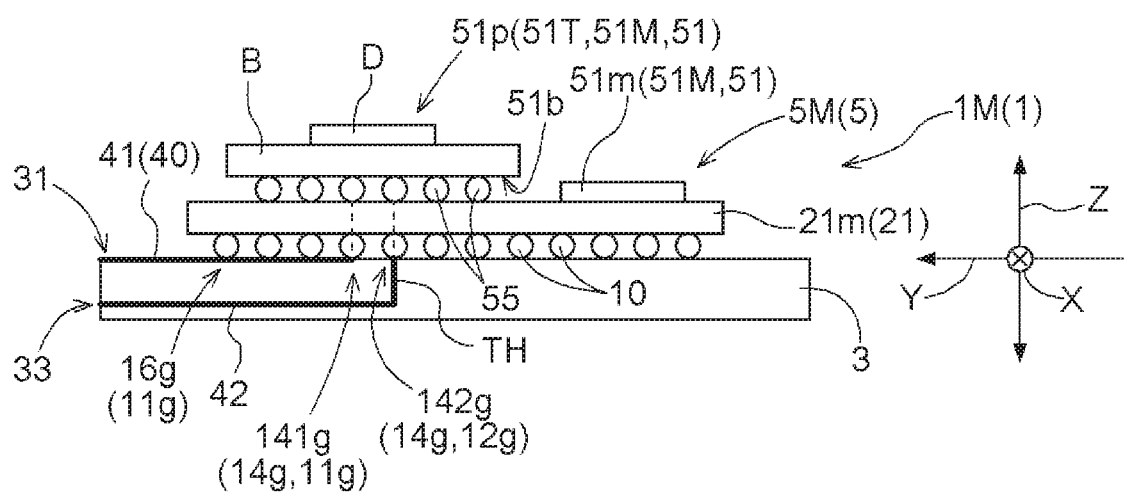
FIG. 16 is a sectional view illustrating the characteristic of the semiconductor device.

In a preferable embodiment, as discussed above, the inner peripheral-side power supply terminal group 14g includes the first power supply terminal group 11g (first inner peripheral-side power supply terminal group 141g) and the second power supply terminal group 12g (second inner peripheral-side power supply terminal group 142g) as power supply terminal groups through which at least two different systems of power are supplied to the target semiconductor element 51T. On the other hand, the outer peripheral-side power supply terminal group 16g does not include terminals of the same system as the second power supply terminal group 12g (second inner peripheral-side power supply terminal group 142g), but includes terminals of the same system as the first power supply terminal group 11g (first inner peripheral-side power supply terminal group 141g). The surface layer power supply wire 40 (surface layer power supply path) is the first power supply wire 41 (first power supply path) which does not overlap the second power supply terminal group 12g (second inner peripheral-side power supply terminal group 142g) as seen in the orthogonal direction Z, but which overlaps the first power supply terminal group 11g (the first inner peripheral-side power supply terminal group 141g and the outer peripheral-side power supply terminal group 16g) to be connected to the first power supply terminal group 11g (the first inner peripheral-side power supply terminal group 141g and the outer peripheral-side power supply terminal group 16g). In this embodiment, with the presence of the second power supply terminal group 12g, the circuit substrate 3 (main substrate) further includes the second power supply wire 42 (second power supply path) which is formed in a wiring layer that is different from the surface layer wiring layer (first surface layer wiring layer 31) on which the semiconductor module 5 is mounted and which is formed continuously so as to extend from a position at which the second power supply wire 42 is connected to the second power supply terminal group 12g toward the outer peripheral side of the circuit substrate 3 (toward the substrate outer peripheral edge 3e). As schematically illustrated in FIG. 16, the first power supply wire 41 and the second power supply wire 42 at least partially overlap each other as seen in the orthogonal direction Z.

A direction from the center of the support substrate 21 toward the outer peripheral side of the support substrate 21 along a normal to a side of the support substrate 21 at which the outer peripheral-side power supply terminal group 16g is disposed is defined as an outer peripheral direction Y. Then, the first power supply terminal group 11g (first inner peripheral-side power supply terminal group 141g) is disposed on the side of the outer peripheral direction with respect to the second power supply terminal group 12g (second inner peripheral-side power supply terminal group 142g).

Here, power to be supplied to the semiconductor module 5 via the first power supply wire 41 is defined as a first power source, and power to be supplied to the semiconductor module 5 via the second power supply wire 42 is defined as a second power source. The length of the first power supply wire 41 (first power supply path) in the width direction X (in particular, the length in the width direction X in a region that overlaps the outer peripheral-side terminal group 17 in the orthogonal direction) is defined as the first power supply wire width W1 (first path width). Similarly, the length of the second power supply wire 42 (second power supply path) in the width direction X (in particular, the length in the width direction X in a region that overlaps the outer peripheral-side terminal group 17 in the orthogonal direction) is defined as the second power supply wire width W2 (second path width).

A region that can be utilized as the first power supply wire width W1 is decided in accordance with the length over which the outer peripheral-side power supply terminal group 16g is arranged continuously in the width direction X. That is, the outer peripheral-side power supply terminal group 16g is disposed so as to be arranged continuously in the width direction X such that a necessary length of the first power supply wire width W1 can be secured. Here, the necessary length of the first power supply wire width W1 is a length that can meet an electrical reference value (first reference value) for the first power source when power is supplied to the first power source of the semiconductor module 5 via the first power supply wire 41. In other words, the outer peripheral-side power supply terminal group 16g is disposed so as to be arranged continuously in the width direction X such that the first power supply wire width W1 (first path width) meets the first reference value which is an electrical reference value for the first power source to be supplied to the semiconductor module 5 via the first power supply wire 41.

Examples of the electrical reference value include electrical parameters including an impedance (an inductance component (reactance) that depends on the frequency, a resistance component that affects the voltage drop, or both), a rated current value, the amplitude of pulsations in a current or a voltage, etc. The second reference value which is an electrical reference value for the second power source to be supplied to the semiconductor module 5 via the second power supply wire 42 is a reference value with a narrower allowable range than that of the first reference value. The term "narrower allowable range" means a lower impedance in the case where the reference value is an impedance, a larger rated current in the case where the reference value is a rated current value, and a smaller allowable amplitude in the case where the reference value is pulsations, for example.

By way of example, the first reference value can include a first rated current value which is a rated current value of the first power source, and the second reference value can include a second rated current value which is a rated current value of the second power source. In this case, the second rated current value, which serves as the second reference value with a narrower allowable range than that of the first reference value, is larger than the first rated current value. The first reference value can include a first impedance which is a maximum allowable value of the impedance of the first power supply wire 41, and the second reference value can include a second impedance which is a maximum allowable value of the impedance of the second power supply wire 42. The second impedance, which serves as the second reference value with a narrower allowable range than that of the first reference value, is lower than the first impedance.

As discussed above, of the terminals 10 included in the outer peripheral-side terminal group 17, terminals 10 disposed at positions at which the signal wires W can occasionally be led out toward the outer peripheral side with respect to the outermost peripheral terminals 18 only by way of through holes TH depending on the presence or absence of the signal wires W which are led out from the terminals 10 disposed on the outer peripheral side with respect to such terminals, with the semiconductor module 5 mounted on the circuit substrate 3, are referred to as the difficult connection terminals 19. The difficult connection terminals 19 are preferably assigned to usage that does not require the signal wires W to be led out toward the outer peripheral side with respect to the outermost peripheral terminals 18. Such terminals assigned to usage that does not require the signal wires W to be led out are referred to as "non-signal connection terminals". As discussed above with reference to FIGS. 2 to 4 and 15, the non-signal output terminals are disposed so as to be arranged continuously in the width direction X such that the second power supply wire width W2 (second path width), which is the length of the second power supply wire 42 in the width direction X, meets the second reference value.

As discussed above with reference to FIGS. 3 and 4, the second power supply wire width W2 (second path width) is larger than the first power supply wire width W1 (first path width). As illustrated in FIG. 2, terminals 10, of the terminals 10 which are included in the outer peripheral-side terminal group 17, that overlap the second power supply wire 42 (second power supply path) as seen in the orthogonal direction Z with the semiconductor module 5 mounted on the circuit substrate 3 and that are not included in the outer peripheral-side power supply terminal group 16g and the non-signal connection terminals are disposed at positions at which the signal wires W can be led out toward the outer peripheral side with respect to the outermost peripheral terminals 18 not by way of the through holes TH. In the example illustrated in FIGS. 2 and 15, such terminals 10 correspond to terminals 10 in the first round from the outer peripheral side and terminals 10 in the second round from the outer peripheral side that are not assigned as the outer peripheral-side power supply terminal group 16g. As discussed above with reference to FIG. 15, the signal wires W can be led out from such terminals 10 toward the outer peripheral side with respect to the outermost peripheral terminals 18 not by way of the through holes TH.

Figure 18:
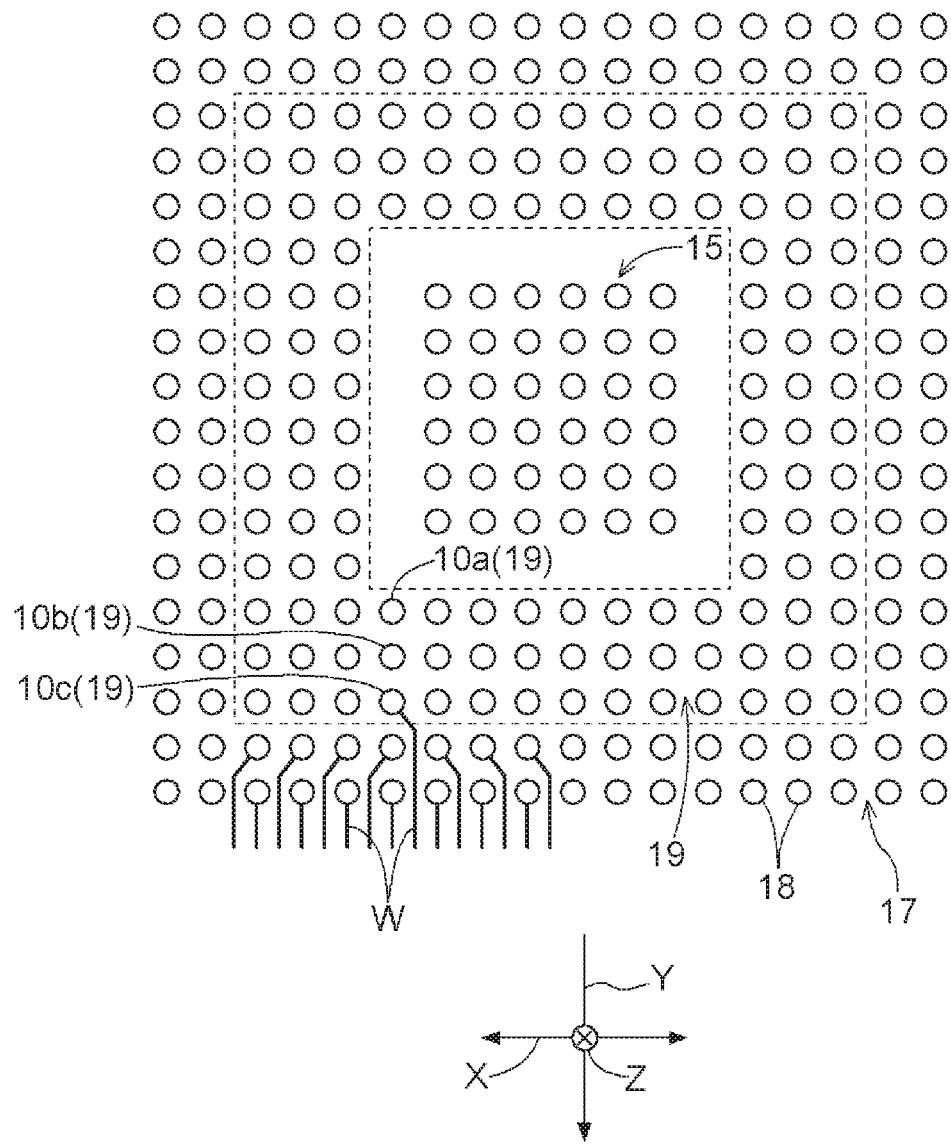
FIG. 18 illustrates another example of the relationship between the terminal arrangement of a semiconductor module and wiring on a circuit substrate.

As discussed above, terminals 10 other than the terminals 10 which are assigned to the outer peripheral-side power supply terminal group 16g in order to meet the first reference value, of the non-signal connection terminals, are preferably assigned to ground terminals or NC terminals through which a signal is not input or output. FIG. 18 illustrates the case where there are a plurality of lines (a plurality of rounds) of the difficult connection terminals 19 in the outer peripheral-side terminal group 17. In this case, the difficult connection terminals 19 can be assigned to the terminals 10 with attributes of two or more of a terminal 10 that belongs to the outer peripheral-side power supply terminal group 16g, a ground terminal, and a signal terminal. In such a case, the order of priority in the assignment of the difficult connection terminals 19 is preferably determined such that a terminal 10 that belongs to the outer peripheral-side power supply terminal group 16g, a ground terminal, and a signal terminal are sequentially provided from the center side of the support substrate 21 toward the outer peripheral side (in the outer peripheral direction Y). For example, in the case of three terminals "10a, 10b, 10c" illustrated in FIG. 18, preferably, the difficult connection terminal "10a" on the innermost peripheral side, of the three terminals, is determined as a terminal 10 that belongs to the outer peripheral-side power supply terminal group 16g, the difficult connection terminal "10b" in the middle is determined as a ground terminal, and the difficult connection terminal "10c" on the outermost peripheral side, of the three terminals, is determined as a signal terminal.

In the embodiment described above with reference to FIGS. 5 and 6, four types of power sources are used. In the embodiment illustrated in FIGS. 5 and 6, the first power supply wire 41 and the third power supply wire 43 are disposed in the first surface layer wiring layer 31, and formed so as to extend in directions opposite to each other. In the case where a plurality of types of power supply wires are formed in the first surface layer wiring layer 31, however, the power supply wires may be formed so as to extend in the same direction (e.g. the outer peripheral direction Y).

Figure 19:
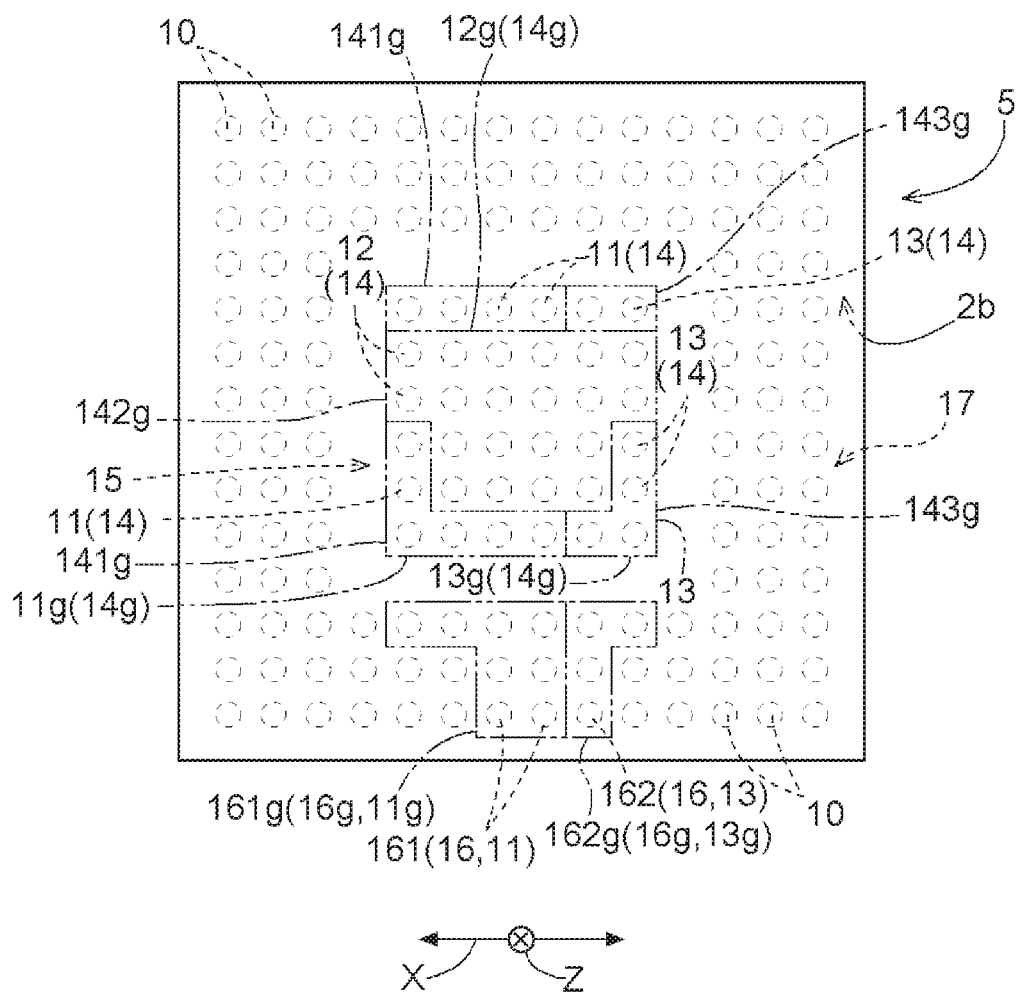
FIG. 19 is a schematic perspective view illustrating another example of the terminal arrangement of a semiconductor module.

FIGS. 19 and 20 illustrate an example of a case where the target semiconductor element 51T has power supply terminals of at least three systems. The inner peripheral-side terminal group 15 further includes a third power supply terminal group 13g (third inner peripheral-side power supply terminal group 143g) of a different system from the first power supply terminal group 11g (first inner peripheral-side power supply terminal group 141g) and the second power supply terminal group 12g (second inner peripheral-side power supply terminal group 142g), compared to the example illustrated in FIGS. 2 and 3. The outer peripheral-side power supply terminal group 16g includes a second outer peripheral-side power supply terminal group 162g of the same system as the third power supply terminal group 13g (third inner peripheral-side power supply terminal group 143g), in addition to a first outer peripheral-side power supply terminal group 161g of the same system as the first power supply terminal group 11g (first inner peripheral-side power supply terminal group 141g). In the inner peripheral-side power supply terminal group 14g, the first power supply terminal group 11g and the third power supply terminal group 13g are disposed such that at least some of the terminals are side by side with each other in the width direction X. The first outer peripheral-side power supply terminal group 161g and the second outer peripheral-side power supply terminal group 162g are disposed such that at least some of the terminals are side by side with each other in the width direction X.

In the example described with reference to FIGS. 19 and 20, the first power source to which power is supplied via the first power supply terminal group 11g which includes the first outer peripheral-side power supply terminal group 161g has a larger rated current than that of the third power source to which power is supplied via the third power supply terminal group 13g which includes the second outer peripheral-side power supply terminal group 162g. As illustrated in FIG. 20, the surface layer power supply wire 40 is also formed with the first power supply wire 41 (first power supply path) which supplies power to the first power source and the third power supply wire 43 (third power supply path) which supplies power to the third power source. The first power supply wire width W1 of the first power supply wire 41, of such power supply wires, is larger than the third power supply wire width W3 of the third power supply wire 43 in accordance with the rated currents.

Other Embodiments

Other embodiments will be described below. The configuration of each embodiment described below is not limited to its independent application, and may be applied in combination with the configuration of other embodiments unless any contradiction occurs.

(1) In the embodiment described above, the terminals 10 of the semiconductor module 5 have roughly two terminal groups, namely the inner peripheral-side terminal group 15 and the outer peripheral-side terminal group 17. The inner peripheral-side power supply terminal group 14g which is included in the inner peripheral-side terminal group 15 is disposed at a position at which at least a part of the inner peripheral-side power supply terminal group 14g overlaps the semiconductor element 51 (target semiconductor element 51T) as seen in the orthogonal direction Z. However, three or more terminal groups may be formed in the semiconductor module 5. For example, as illustrated in FIG. 21, the terminals 10 may have a first terminal group 101 arranged on the most central side, a second terminal group 103 arranged on the outer peripheral side with respect to the first terminal group 101, and a third terminal group 105 arranged on the outer peripheral side with respect to the second terminal group 103.

Figure 21:
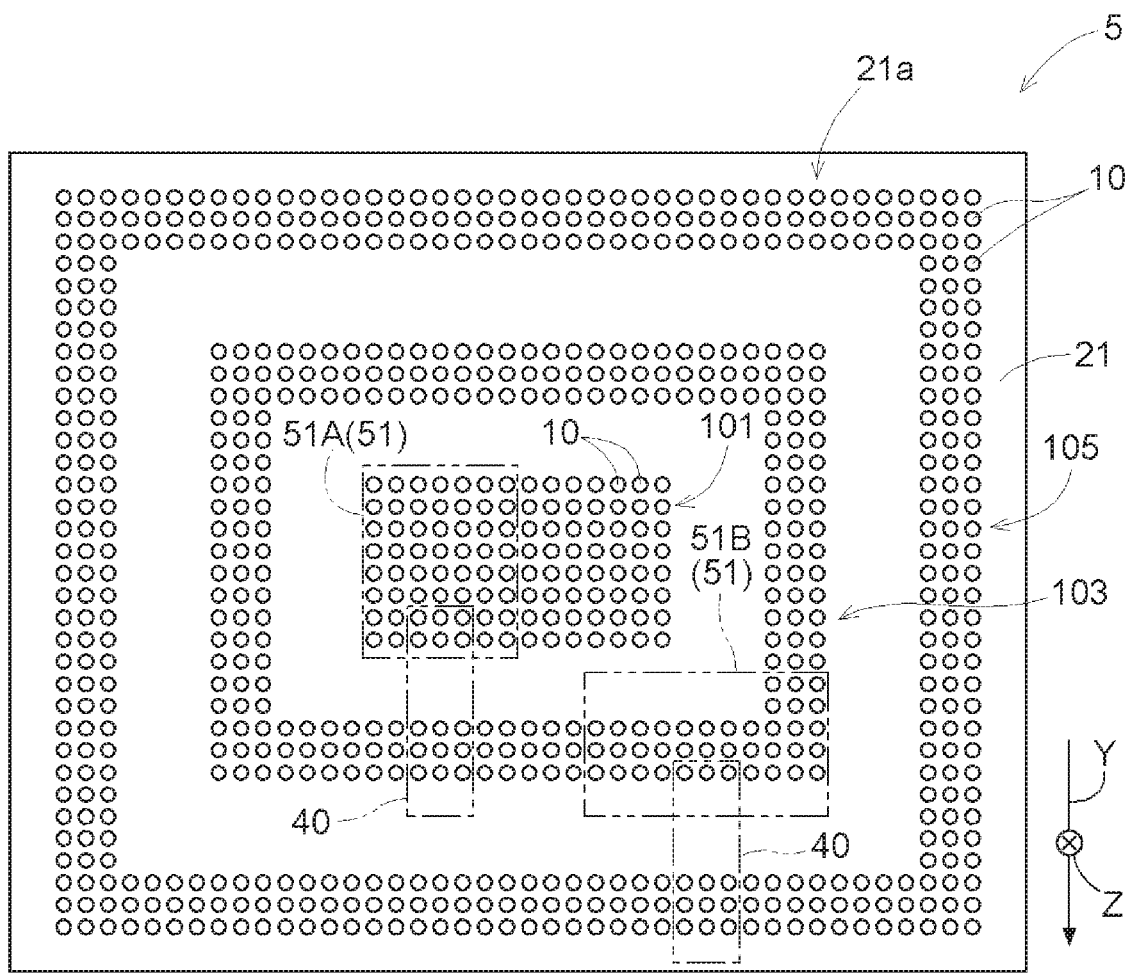
FIG. 21 illustrates the relationship between connection terminals provided on a support substrate and the positions of arrangement of semiconductor elements on the support substrate.

Here, as illustrated in FIG. 21, in the case where the semiconductor element 51 (51A) is provided so as to overlap the first terminal group 101 as seen in the orthogonal direction Z, the first terminal group 101 corresponds to the inner peripheral-side terminal group 15, and the inner peripheral-side power supply terminal group 14g is included in the first terminal group 101 which serves as the inner peripheral-side terminal group 15. At least the second terminal group 103 corresponds to the outer peripheral-side terminal group 17, and the outer peripheral-side power supply terminal group 16g is included in the second terminal group 103 which serves as the outer peripheral-side terminal group 17. As illustrated in FIG. 21, the surface layer power supply wire 40 is formed so as to overlap the first terminal group 101 (inner peripheral-side power supply terminal group 14g) and the second terminal group 103 (outer peripheral-side power supply terminal group 16g) as seen in the orthogonal direction Z. As a matter of course, although not illustrated, the second terminal group 103 and the third terminal group 105 may correspond to the outer peripheral-side terminal group 17. In this case, the outer peripheral-side power supply terminal group 16g is included in the second terminal group 103 and the third terminal group 105, and the surface layer power supply wire 40 overlaps the third terminal group 105 in addition to the second terminal group 103.

As illustrated in FIG. 21, in the case where the semiconductor element 51 (51B) is provided so as to overlap the second terminal group 102 as seen in the orthogonal direction Z, the second terminal group 103 corresponds to the inner peripheral-side terminal group 15, and the inner peripheral-side power supply terminal group 14g is included in the second terminal group 103 which serves as the inner peripheral-side terminal group 15. In this case, the third terminal group 105 corresponds to the outer peripheral-side terminal group 17, and the outer peripheral-side power supply terminal group 16g is included in the third terminal group 105 which serves as the outer peripheral-side terminal group 17. As illustrated in FIG. 21, the surface layer power supply wire 40 is formed so as to overlap the second terminal group 103 (inner peripheral-side power supply terminal group 14g) and the third terminal group 105 (outer peripheral-side power supply terminal group 16g) as seen in the orthogonal direction Z.

(2) In the embodiment described above, a separate inner layer wiring layer (first inner layer wiring layer 32) in which a ground layer is formed is provided between the surface layer wiring layer (first surface layer wiring layer 31) in which the first power supply wire 41 is formed and one inner layer wiring layer (second inner layer wiring layer 33) in which the second power supply wire 42 is formed. However, the circuit substrate 3 may be configured with such a ground layer interposed between the surface layer wiring layer (31) in which the first power supply wire 41 is formed and one inner layer wiring layer in which the second power supply wire 42 is formed.

Overview of Embodiments

The overview of the semiconductor device (1), the chip module (5M), and the semiconductor module (5) described above will be briefly described below.

One aspect provides a semiconductor device (1) including:

a chip module (5M) that includes a module substrate (21*m*) in a rectangular plate shape, on an upper surface of which at least one semiconductor chip (51M) is supported and fixed, and a plurality of connection terminals disposed planarly along a lower surface (21*b*) of the module substrate (21*m*) and electrically connected to the semiconductor chip (51M), the semiconductor chip (51M) including a package substrate (B) and at least one semiconductor die (D) supported by the package substrate (B); and a main substrate (3) which has a plurality of wiring layers (31, 32, 33, 39) and on which the chip module (5M) is surface-mounted via the plurality of connection terminals (10), the substrate being formed with a plurality of through holes (TH) that penetrate the substrate and that enable the plurality of wiring layers (31, 32, 33, 39) to be electrically connected to each other, in which the semiconductor chip (51M (51*p*)) has a plurality of chip terminals (55) disposed planarly along a supported surface (51*b*) supported by the module substrate (21*m*) and electrically connected to the module substrate (21*m*), the plurality of chip terminals (55) include a plurality of chip power supply terminals (56) through which power is supplied to the semiconductor chip (51M (51*p*)), the plurality of chip power supply terminals (56) are disposed on an inner side with respect to an outer edge (R1*e*) of an arrangement region (R1) in which the plurality of chip terminals (55) are disposed planarly, the chip module (5M) is configured such that the semiconductor chip (51M (51*p*)) is mounted on the module substrate (21*m*), and an arrangement of the plurality of chip terminals (55) and an arrangement of the plurality of connection terminals (10) are changed in the module substrate (21*m*), the plurality of connection terminals (10) are arranged in a plurality of rectangular rings along sides of the module substrate (21*m*), and the plurality of connection terminals (10) include an inner peripheral-side terminal group (15) arranged on a center side of the module substrate (21*m*) and an outer peripheral-side terminal group (17) arranged on an outer peripheral side with respect to the inner peripheral-side terminal group (15), the inner peripheral-side terminal group (15) includes an inner peripheral-side power supply terminal group (14*g*) through which power is supplied to the semiconductor chip (51M (51*p*)), the outer peripheral-side terminal group (17) includes an outer peripheral-side power supply terminal group (16*g*) of the same system as at least a part of the inner peripheral-side power supply terminal group (14*g*), the inner peripheral-side power supply terminal group (14*g*) is disposed at a position at which at least a part of the inner peripheral-side power supply terminal group (14*g*) overlaps the semiconductor chip (51M (51*p*)) as seen in a direction that is orthogonal to a plate surface of the module substrate (21*m*), the outer peripheral-side power supply terminal group (16*g*) is arranged so as to be continuous from the inner peripheral-side power supply terminal group (14*g*) to an outermost peripheral terminal (18) of the outer peripheral-side terminal group (17), the main substrate (3) has a surface layer power supply path (40), through which power is supplied to the semiconductor chip (51M (51*p*)) via the inner peripheral-side power supply terminal group (14*g*) and the outer peripheral-side power supply terminal group (16*g*), in a surface layer wiring layer (31) on which the chip module (5M) is mounted, and the surface layer power supply path (40) overlaps the inner peripheral-side power supply terminal group (14*g*) and the outer peripheral-side power supply terminal group (16*g*) as seen in an orthogonal direction (Z) that is orthogonal to a substrate surface of the main substrate (3) with the chip module (5M) mounted on the main substrate (3), and is formed continuously so as to extend from a position at which the surface layer power supply path (40) is connected to the inner peripheral-side power supply terminal group (14*g*) toward an outer peripheral side of the main substrate (3).

Another aspect provides a chip module (5M) that includes a module substrate (21*m*) in a rectangular plate shape, on an upper surface of which at least one semiconductor chip (51M) is supported and fixed, and a plurality of connection terminals disposed planarly along a lower surface (21*b*) of the module substrate (21*m*) and electrically connected to the semiconductor chip (51M), the semiconductor chip (51M) including a package substrate (B) and at least one semiconductor die (D) supported by the package substrate (B), in which the semiconductor chip (51M (51*p*)) has a plurality of chip terminals (55) disposed planarly along a supported surface (51*b*) supported by the module substrate (21*m*) and electrically connected to the module substrate (21*m*), the plurality of chip terminals (55) include a plurality of chip power supply terminals (56) through which power is supplied to the semiconductor chip (51M (51*p*)), the plurality of chip power supply terminals (56) are disposed on an inner side with respect to an outer edge (R1*e*) of an arrangement region (R1) in which the plurality of chip terminals (55) are disposed planarly, the semiconductor chip (51M (51*p*)) is mounted on the module substrate (21*m*), an arrangement of the plurality of chip terminals (55) and an arrangement of the plurality of connection terminals are changed in the module substrate (21*m*), the plurality of connection terminals (10) are arranged in a plurality of rectangular rings along sides of the module substrate (21*m*), and the plurality of connection terminals (10) include an inner peripheral-side terminal group (15) arranged on a center side of the module substrate (21*m*) and an outer peripheral-side terminal group (17) arranged on an outer peripheral side with respect to the inner peripheral-side terminal group (15), the inner peripheral-side terminal group (15) includes an inner peripheral-side power supply terminal group (14*g*) connected to a power supply terminal of the semiconductor chip (51M (51*p*)), the outer peripheral-side terminal group (17) includes an outer peripheral-side power supply terminal group (16*g*) of the same system as at least a part of the inner peripheral-side power supply terminal group (14*g*), the inner peripheral-side power supply terminal group (14*g*) is disposed at a position at which at least a part of the inner peripheral-side power supply terminal group (14*g*) overlaps the semiconductor chip (51M (51*p*)) as seen in a direction that is orthogonal to a plate surface of the module substrate (21*m*), and the outer peripheral-side power supply terminal group (16*g*) is arranged so as to be continuous from the inner peripheral-side power supply terminal group (14*g*) to an outermost peripheral terminal (18) of the outer peripheral-side terminal group (17).

In the configuration described above, the inner peripheral-side power supply terminal group (14*g*) is disposed at a position at which at least a part of the inner peripheral-side power supply terminal group (14*g*) overlaps the semiconductor chip (51M (51*p*)) as seen in a direction that is orthogonal to a plate surface of the module substrate (21*m*), and thus the inner peripheral-side power supply terminal group (14*g*) is disposed directly below the semiconductor chip (51M (51*p*)). Thus, the power supply terminals of the semiconductor chip (51M (51*p*)) and the power supply terminals of the chip module (5M) can be connected to each other over a short wiring distance, which suppresses the impedance of the wiring to be low. In order to form a short power supply path for the semiconductor die (D), the chip power supply terminals (56) are generally provided directly below the semiconductor die (D) (in general, the module substrate (21*m*) and the package substrate (B) are disposed in parallel with each other, and thus the chip power supply terminals (56) are provided at positions at which the chip power supply terminals (56) overlap at least a part of the semiconductor die (D) as seen in a direction that is orthogonal to the plate surface of the module substrate (21*m*) (package substrate (B))). Thus, the inner peripheral-side power supply terminal group (14*g*) can also be considered as being disposed at a position at which at least a part of the inner peripheral-side power supply terminal group (14*g*) overlaps the semiconductor die (D) (the semiconductor die (D) of the semiconductor chip 51M (51*p*)) as seen in a direction that is orthogonal to the plate surface of the module substrate (21*m*).

In the semiconductor device (1), the surface layer power supply path (40) through which power is supplied to the semiconductor chip (51M (51*p*)) is formed in the surface layer wiring layer (31) on which the chip module (5M) is mounted. The surface layer power supply path (40) overlaps the inner peripheral-side power supply terminal group (14*g*) and the outer peripheral-side power supply terminal group (16*g*), through which power is supplied to the semiconductor chip (51M (51*p*)) via the module substrate (21*m*), as seen in the orthogonal direction (Z). Thus, the inner peripheral-side power supply terminal group (14*g*) and the outer peripheral-side power supply terminal group (16*g*) of the chip module (5M), which is surface-mounted on the surface layer wiring layer (31), are directly connected to the surface layer power supply path (40). There is no need to provide the surface layer power supply path (40) with through holes (TH) through which other signals are to be led out, or with holes or an insulation region, and thus the impedance of the surface layer power supply path (40) can also be suppressed to be low. With the configuration described above, in this way, a semiconductor device (1) and a chip module (5M) that are capable of suppressing a decrease in the effective area of wiring due to through holes (TH) and enable stable power supply can be provided.

For example, in the case where the semiconductor chip (51M (51*p*)) is a processor such as a general-purpose microcomputer or DSP, the terminal arrangement (the terminal arrangement of the chip terminals (55)) is decided by the semiconductor vendor. That is, the terminal arrangement is not suitable for device manufacturers that produce apparatuses utilizing such microcomputers and DSPs in many cases. It is not impossible to produce microcomputers and DSPs as dedicated products with a terminal arrangement that is suitable for the device manufacturers. However, it is not profitable and not realistic in consideration of the development cost for the dedicated products etc. In the chip module (5M), the terminal arrangement can be changed using wiring on the module substrate (21*m*), and thus the terminal arrangement of the connection terminals (10) on the chip module (5M) can be made suitable for the device manufacturers. As a result, as discussed above, power can be supplied to the semiconductor chip (51M (51*p*)) through the surface layer power supply path (40) which is formed in the surface layer wiring layer (31) of the main substrate (3).

In the chip module (5M), preferably, the inner peripheral-side power supply terminal group (14*g*) includes: a first inner peripheral-side power supply terminal group (141*g*) and a second inner peripheral-side power supply terminal group (142*g*) as power supply terminal groups to be connected to power supply terminals of at least two different systems of the semiconductor chip (51M (51*p*)); and the outer peripheral-side power supply terminal group (16*g*) does not include a terminal of the same system as the second inner peripheral-side power supply terminal group (142*g*), but includes a terminal of the same system as the first inner peripheral-side power supply terminal group (141*g*).

The semiconductor device (1) is preferably configured as follows. That is, preferably, the inner peripheral-side power supply terminal group (14*g*) includes a first inner peripheral-side power supply terminal group (141*g*) and a second inner peripheral-side power supply terminal group (142*g*) as power supply terminal groups through which at least two different systems of power are supplied to the semiconductor chip (51M (51*p*)); the outer peripheral-side power supply terminal group (16*g*) does not include a terminal of the same system as the second inner peripheral-side power supply terminal group (142*g*), but includes a terminal of the same system as the first inner peripheral-side power supply terminal group (141*g*); the surface layer power supply path (40) is a first power supply path (41) that does not overlap the second inner peripheral-side power supply terminal group (142*g*) as seen in the orthogonal direction (X), but that overlaps the first inner peripheral-side power supply terminal group (141*g*) and the outer peripheral-side power supply terminal group (16*g*) to be connected to the first inner peripheral-side power supply terminal group (141*g*) and the outer peripheral-side power supply terminal group (16*g*); the main substrate (3) further includes a second power supply path (42) formed in a wiring layer (33) that is different from the surface layer wiring layer (31) on which the chip module (5M) is mounted, the second power supply path (42) being formed continuously so as to extend from a position at which the second power supply path (42) is connected to the second inner peripheral-side power supply terminal group (142*g*) toward the outer peripheral side of the main substrate (3); and the first power supply path (41) and the second power supply path (42) at least partially overlap each other as seen in the orthogonal direction (Z).

By assigning the power supply terminal groups corresponding to the power supply terminals of two systems of the semiconductor chip (51M (51*p*)) to the inner peripheral-side power supply terminal group (14*g*), the power supply terminals of the semiconductor chip (51M (51*p*)) and power supply terminals of the semiconductor module (5) can be connected to each other over a short wiring distance, which suppresses the impedance of the wiring to be low.

Only terminals of the same system as the first inner peripheral-side power supply terminal group (141g), of the power supply terminal groups of two systems that belong to the inner peripheral-side power supply terminal group (14g), are included in the outer peripheral-side power supply terminal group (16g) which is arranged continuously to the outermost peripheral terminal (18). Thus, at least the first inner peripheral-side power supply terminal group (141g) and the outer peripheral-side power supply terminal group (16g) can be supplied with power via the power supply wiring which is continuous on the substrate on which the chip module is mounted.

In the semiconductor device (1), the first inner peripheral-side power supply terminal group (141g) and the outer peripheral-side power supply terminal group (16g) of the chip module (5M) which is mounted on the main substrate (3) can be supplied with power via the surface layer power supply path (40) (first power supply path (41)) which is formed in the surface layer wiring layer (31). The second inner peripheral-side power supply terminal group (142g) of the chip module (5M) which is mounted on the main substrate (3) is supplied with power via the second power supply path (42) which is formed in a wiring layer (33) that is different from the surface layer wiring layer (31). The first power supply path (41) and the second power supply path (42) at least partially overlap each other as seen in the orthogonal direction (Z), and the first inner peripheral-side power supply terminal group (141g) and the outer peripheral-side power supply terminal group (16g) overlap the first power supply path (41) as seen in the orthogonal direction (Z). There is no need to provide the first power supply path (41) with through holes (TH), and thus the second power supply path (42) is also not provided with through holes (TH) for transferring other power or signals at least in a portion that overlaps the first power supply path (41). Thus, a decrease in the effective area of the second power supply path (42) due to through holes (TH) is suppressed. That is, a semiconductor device (1) that enables stable power supply via the first power supply path (41) and the second power supply path (42) can be provided.

In the semiconductor device (1) according to one aspect, a direction along a side of the module substrate (21m) at which the outer peripheral-side power supply terminal group (16g) is disposed with the chip module (5M) mounted on the main substrate (3) is defined as a width direction (X); and the outer peripheral-side power supply terminal group (16g) is disposed so as to be arranged continuously in the width direction (X) such that a first path width (W1), which is a length of the first power supply path (41) in the width direction (X), meets a first reference value, which is an electrical reference value for a first power source to be supplied to the semiconductor module (5) via the first power supply path (41).

In general, a large current flows through wiring through which a power source is supplied compared to signal wires, and therefore such wiring has a large wire width compared to the signal wires in order to have a large cross-sectional area. A necessary wire width can be secured for the first power supply path (41) with the outer peripheral-side power supply terminal group (16g) arranged continuously in the width direction (X) in order to meet the first reference value.

Here, preferably, a second reference value, which is an electrical reference value for a second power source to be supplied to the chip module (5M) via the second power supply path (42), is a reference value with a narrower allowable range than that of the first reference value.

In the case where the second reference value has a narrower allowable range than that of the first reference value and imposes a stricter condition, priority is occasionally given to a condition for forming the second power supply path (42), rather than the first power supply path (41), such as increasing the cross-sectional area of the wiring, for example. The second power supply path (42) is formed in a wiring layer that is different from the surface layer wiring layer (31) on which the chip module (5M) is mounted, and thus constraints on the mounting and constraints on the signal wires in the surface layer wiring layer (31) can be preferably suppressed.

In one aspect, preferably, of the connection terminals (10) included in the outer peripheral-side terminal group (16g), connection terminals (10) disposed at positions at which signal wires (W) can occasionally be led out toward an outer peripheral side with respect to the outermost peripheral terminal (18) only by way of the through holes (TH) depending on presence or absence of signal wires (W) led out from the connection terminals (10) disposed on an outer peripheral side with respect to such terminals with the chip module (5M) mounted on the main substrate (3) are defined as difficult connection terminals (19); of the difficult connection terminals (19), terminals assigned to usage that does not require the signal wires (W) to be led out toward the outer peripheral side with respect to the outermost peripheral terminal (18) are defined as non-signal connection terminals; and the non-signal connection terminals are disposed so as to be arranged continuously in the width direction (X) such that a second path width (W2), which is a length of the second power supply path (42) in the width direction (X), meets the second reference value.

There is no need to provide through holes (TH) at positions to which the non-signal connection terminals are connected even if the connection terminals (10) are the difficult connection terminals (19). A necessary wire width can be secured for the second power supply path (42) with the non-signal connection terminals arranged continuously in the width direction (X) in order to meet the second reference value.

In one aspect, preferably, the second path width (W2) is larger than the first path width (W1); and of the connection terminals (10) included in the outer peripheral-side terminal group (18), connection terminals (10) that overlap the second power supply path (42) as seen in the orthogonal direction (Z) with the chip module (5M) mounted on the main substrate (3) and that are not included in the outer peripheral-side power supply terminal group (16g) and the non-signal connection terminals are disposed at positions at which signal wires (W) can be led out toward the outer peripheral side with respect to the outermost peripheral terminal (18) not by way of the through holes (TH).

There is no need to provide a through hole (TH) at any of the positions to which the connection terminals (10) which overlap the second power supply path (42) as seen in the orthogonal direction (Z) are connected, which suppresses a decrease in the effective area of the second power supply path (42) and enables stable power supply.

In one aspect, preferably, connection terminals (10), of the non-signal connection terminals, other than the connection terminals (10) which are assigned to the outer peripheral-side power supply terminal group (16g) in order to meet the first reference value are assigned to a ground terminal or an NC terminal through which a signal is not input or output.

The ground terminal and the NC terminal are not required to be connected to other wiring layers via the through holes (TH), and thus are suitable as the non-signal connection terminals.

In one aspect, preferably, in the case where the difficult connection terminals (19) are assigned to the connection terminals (10) with attributes of two or more of the connection terminal (10) which belongs to the outer peripheral-side power supply terminal group (16g), the ground terminal, and a signal terminal, an order of priority in assignment of the difficult connection terminals (19) is determined such that the connection terminal (10) which belongs to the outer peripheral-side power supply terminal group (16g), the ground terminal, and the signal terminal are sequentially provided from a center side of the module substrate (21m) toward an outer peripheral side.

It is more likely that the signal wires (W) which are connected to the connection terminals (10) disposed more toward the outer peripheral side can be led out toward the outer peripheral side with respect to the outermost peripheral terminal (18) through the surface layer wiring layer (31) not via the through holes (TH). Thus, the difficult connection terminals (19) are preferably assigned to the connection terminals (10) in the order of priority described above.

Preferably, the first reference value includes a first rated current value which is a rated current value of the first power source, the second reference value includes a second rated current value which is a rated current value of the second power source, and the second rated current value is larger than the first rated current value.

In the case where the second rated current value is larger than the first rated current value, priority is occasionally given to a condition for forming the second power supply path (42), rather than the first power supply path (41), such as increasing the cross-sectional area of the wiring, for example. The second power supply path (42) is formed in a wiring layer that is different from the surface layer wiring layer (31) on which the chip module (5M) is mounted, and thus constraints on the mounting and constraints on the signal wires in the surface layer wiring layer (31) can be preferably suppressed.

Preferably, the first reference value includes a first impedance which is a maximum allowable value of an impedance of the first power supply path (41), the second reference value includes a second impedance which is a maximum allowable value of an impedance of the second power supply path, and the second impedance is lower than the first impedance.

In the case where the second impedance is lower than the first impedance, priority is occasionally given to a condition for forming the second power supply path (42), rather than the first power supply path (41). The second power supply path (42) is formed in a wiring layer that is different from the surface layer wiring layer (31) on which the semiconductor module (5) is mounted, and thus constraints on the mounting and constraints on the signal wires in the surface layer wiring layer (31) can be preferably suppressed.

In one aspect, preferably, the semiconductor chip (51M (51p)) has power supply terminals of at least three systems; the inner peripheral-side terminal group (14g) further includes a third inner peripheral-side power supply terminal group (143g) of a different system from the first inner peripheral-side power supply terminal group (141g) and the second inner peripheral-side power supply terminal group (142g); and the outer peripheral-side power supply terminal group (16g) includes a second outer peripheral-side power supply terminal group (162g) of the same system as the third inner peripheral-side power supply terminal group (143g), in addition to a first outer peripheral-side power supply terminal group (161g) of the same system as the first inner peripheral-side power supply terminal group (141g).

The surface layer power supply path (40) can be provided in correspondence with two systems of power sources, and thus a semiconductor device (1) that is capable of suppressing a decrease in the effective area of wiring due to through holes (TH) and enables stable power supply to the chip module (5M) can be provided.

Preferably, a direction along a side of the module substrate (21m) at which the outer peripheral-side power supply terminal group (16g) is disposed with the chip module (5M) mounted on the main substrate (3) is defined as a width direction (X); and the first inner peripheral-side power supply terminal group (141g) and the third inner peripheral-side power supply terminal group (143g) are disposed such that at least some of the terminals are side by side with each other in the width direction (X), and the first outer peripheral-side power supply terminal group (161g) and the second outer peripheral-side power supply terminal group (162g) are disposed such that at least some of the terminals are side by side with each other in the width direction (X).

Two surface layer power supply paths (41, 43) corresponding to two systems of power sources can be arranged side by side so as to extend in parallel in the width direction (X), and thus the two surface layer power supply paths (41, 43) can be formed with a high wiring efficiency.

Preferably, a direction from a center of the module substrate (21m) toward an outer peripheral side of the module substrate (21m) along a normal to a side of the module substrate (21m) at which the outer peripheral-side power supply terminal group (16g) is disposed is defined as an outer peripheral direction (Y); and the first inner peripheral-side power supply terminal group (141g) is disposed on a side of the outer peripheral direction (Y) with respect to the second inner peripheral-side power supply terminal group (142g).

The first inner peripheral-side power supply terminal group (141g), of the inner peripheral-side power supply terminal group (14g), is disposed on the side on which the first power supply path (41) serving as the surface layer power supply path (40) extends toward the outer peripheral side, and thus the first power supply path (41) can be formed with a high wiring efficiency.

An additional aspect provides a semiconductor device (1) including:
  a semiconductor module (5) that includes a support substrate (21) in a rectangular plate shape, on an upper surface (21a) of which one or more semiconductor elements (51) are supported and fixed, and a plurality of connection terminals (10) disposed planarly along a lower surface (21b) of the support substrate (21) and electrically connected to the semiconductor elements (51); and
  a main substrate (3) which has a plurality of wiring layers (31, 32, 33, 39) and on which the semiconductor module (5) is surface-mounted via the plurality of connection terminals (10), the substrate being formed with a plurality of through holes (TH) that penetrate the substrate and that enable the plurality of wiring layers (31, 32, 33, 39) to be electrically connected to each other, in which
  the plurality of connection terminals (10) are arranged in a plurality of rectangular rings along sides of the support substrate (21), and the plurality of connection terminals (10) include an inner peripheral-side terminal group (15) arranged on a center side of the support substrate (21) and an outer peripheral-side terminal group (17) arranged on an outer peripheral side with respect to the inner peripheral-side terminal group (15),
the inner peripheral-side terminal group (15) includes an inner peripheral-side power supply terminal group (14g) through which power is supplied to a target semiconductor element (51T) which is one of the semiconductor elements (51),
the outer peripheral-side terminal group (17) includes an outer peripheral-side power supply terminal group (16g) of the same system as at least a part of the inner peripheral-side power supply terminal group (14g),
the inner peripheral-side power supply terminal group (14g) is disposed at a position at which at least a part of the inner peripheral-side power supply terminal group (14g) overlaps the target semiconductor element (51T) as seen in a direction that is orthogonal to a plate surface of the support substrate (21),
the outer peripheral-side power supply terminal group (16g) is arranged so as to be continuous from the inner peripheral-side power supply terminal group (14g) to an outermost peripheral terminal (18) of the outer peripheral-side terminal group (17),
the main substrate (3) has a surface layer power supply path (40), through which power is supplied to the target semiconductor element (51T) via the inner peripheral-side power supply terminal group (14g) and the outer peripheral-side power supply terminal group (16g), in a surface layer wiring layer (31) on which the semiconductor module (5) is mounted, and
the surface layer power supply path (40) overlaps the inner peripheral-side power supply terminal group (14g) and the outer peripheral-side power supply terminal group (16g) as seen in an orthogonal direction (Z) that is orthogonal to a substrate surface of the main substrate (3) with the semiconductor module (5) mounted on the main substrate (3), and is formed continuously so as to extend from a position at which the surface layer power supply path (40) is connected to the inner peripheral-side power supply terminal group (14g) toward an outer peripheral side of the main substrate (3).

Yet another aspect provides a semiconductor module (5) that includes a support substrate (21) in a rectangular plate shape, on an upper surface (21a) of which one or more semiconductor elements (51) are supported and fixed, and a plurality of connection terminals (10) disposed planarly along a lower surface (21b) of the support substrate (21) and electrically connected to the semiconductor elements (51), in which
the plurality of connection terminals (10) are arranged in a plurality of rectangular rings along sides of the support substrate (21), and the plurality of connection terminals (10) include an inner peripheral-side terminal group (15) arranged on a center side of the support substrate (21) and an outer peripheral-side terminal group (17) arranged on an outer peripheral side with respect to the inner peripheral-side terminal group (15),
the inner peripheral-side terminal group (15) includes an inner peripheral-side power supply terminal group (14g) connected to a power supply terminal of a target semiconductor element (51) which is one of the semiconductor elements (51),
the outer peripheral-side terminal group (17) includes an outer peripheral-side power supply terminal group (16g) of the same system as at least a part of the inner peripheral-side power supply terminal group (14g),
the inner peripheral-side power supply terminal group (14g) is disposed at a position at which at least a part of the inner peripheral-side power supply terminal group (14g) overlaps the target semiconductor element (51T) as seen in a direction that is orthogonal to a plate surface of the support substrate (21), and
the outer peripheral-side power supply terminal group (16g) is arranged so as to be continuous from the inner peripheral-side power supply terminal group (14g) to an outermost peripheral terminal (18) of the outer peripheral-side terminal group (17).

In the configuration described above, the inner peripheral-side power supply terminal group (14g) is disposed at a position at which at least a part of the inner peripheral-side power supply terminal group (14g) overlaps the target semiconductor element (51T) as seen in a direction that is orthogonal to a plate surface of the support substrate (21), and thus the inner peripheral-side power supply terminal group (14g) is disposed directly below the target semiconductor element (51T). Thus, the power supply terminals of the target semiconductor element (51T) and the power supply terminals of the semiconductor module (5) can be connected to each other over a short wiring distance, which suppresses the impedance of the wiring to be low. In the semiconductor device (1), the surface layer power supply path (40) through which power is supplied to the target semiconductor element (51T) is formed in the surface layer wiring layer (31) on which the semiconductor module (5) is mounted. The surface layer power supply path (40) overlaps the inner peripheral-side power supply terminal group (14g) and the outer peripheral-side power supply terminal group (16g), through which power is supplied to the target semiconductor element (51T) via the support substrate (21), as seen in the orthogonal direction (Z). Thus, the inner peripheral-side power supply terminal group (14g) and the outer peripheral-side power supply terminal group (16g) of the semiconductor module (5), which is surface-mounted on the surface layer wiring layer (31), are directly connected to the surface layer power supply path (40). There is no need to provide the surface layer power supply path (40) with through holes (TH) through which other signals are to be led out, or with holes or an insulation region, and thus the impedance of the surface layer power supply path (40) can also be suppressed to be low. With the configuration described above, in this way, a semiconductor device (1) and a semiconductor module (5) that are capable of suppressing a decrease in the effective area of wiring due to through holes (TH) and enable stable power supply can be provided.

In the semiconductor module (5), preferably, the inner peripheral-side power supply terminal group (14g) includes a first inner peripheral-side power supply terminal group (141g) and a second inner peripheral-side power supply terminal group (142g) as power supply terminal groups to be connected to power supply terminals of at least two different systems of the target semiconductor element (51T); and the outer peripheral-side power supply terminal group (16g) does not include a terminal of the same system as the second inner peripheral-side power supply terminal group (142g), but includes a terminal of the same system as the first inner peripheral-side power supply terminal group (141g).

The semiconductor device (1) is preferably configured as follows. That is, preferably, the inner peripheral-side power supply terminal group (14g) includes a first inner peripheral-side power supply terminal group (141g) and a second inner peripheral-side power supply terminal group (142g) as power supply terminal groups through which at least two different systems of power are supplied to the target semiconductor element (51T); the outer peripheral-side power supply terminal group (16g) does not include a terminal of the same system as the second inner peripheral-side power supply terminal group (142g), but includes a terminal of the same system as the first inner peripheral-side power supply terminal group (141g); the surface layer power supply path (40) is a first power supply path (41) that does not overlap the second inner peripheral-side power supply terminal group (142g) as seen in the orthogonal direction (X), but that overlaps the first inner peripheral-side power supply terminal group (141g) and the outer peripheral-side power supply terminal group (16g) to be connected to the first inner peripheral-side power supply terminal group (141g) and the outer peripheral-side power supply terminal group (16g); the main substrate (3) further includes a second power supply path (42) formed in a wiring layer (33) that is different from the surface layer wiring layer (31) on which the semiconductor module (5) is mounted, the second power supply path (42) being formed continuously so as to extend from a position at which the second power supply path (42) is connected to the second inner peripheral-side power supply terminal group (142g) toward the outer peripheral side of the main substrate (3); and the first power supply path (41) and the second power supply path (42) at least partially overlap each other as seen in the orthogonal direction (Z).

By assigning the power supply terminal groups corresponding to the power supply terminals of two systems of the target semiconductor element (51T) to the inner peripheral-side power supply terminal group (14g), the power supply terminals of the target semiconductor element (51T) and the power supply terminals of the semiconductor module (5) can be connected to each other over a short wiring distance, which suppresses the impedance of the wiring to be low. Only terminals of the same system as the first inner peripheral-side power supply terminal group (141g), of the power supply terminal groups of two systems that belong to the inner peripheral-side power supply terminal group (14g), are included in the outer peripheral-side power supply terminal group (16g) which is arranged continuously to the outermost peripheral terminal (18). Thus, at least the first inner peripheral-side power supply terminal group (141g) and the outer peripheral-side power supply terminal group (16g) can be supplied with power via the power supply wiring which is continuous on the substrate on which the chip module is mounted.

In the semiconductor device (1), the first inner peripheral-side power supply terminal group (141g) and the outer peripheral-side power supply terminal group (16g) of the semiconductor module (5) which is mounted on the main substrate (3) can be supplied with power via the surface layer power supply path (40) (first power supply path (41)) which is formed in the surface layer wiring layer (31). The second inner peripheral-side power supply terminal group (142g) of the semiconductor module (5) which is mounted on the main substrate (3) is supplied with power via the second power supply path (42) which is formed in a wiring layer (33) that is different from the surface layer wiring layer (31). The first power supply path (41) and the second power supply path (42) at least partially overlap each other as seen in the orthogonal direction (Z), and the first inner peripheral-side power supply terminal group (141g) and the outer peripheral-side power supply terminal group (16g) overlap the first power supply path (41) as seen in the orthogonal direction (Z). There is no need to provide the first power supply path (41) with through holes (TH), and thus the second power supply path (42) is also not provided with through holes (TH) for transferring other power or signals at least in a portion that overlaps the first power supply path (41). Thus, a decrease in the effective area of the second power supply path (42) due to through holes (TH) is suppressed. That is, a semiconductor device (1) that enables stable power supply via the first power supply path (41) and the second power supply path (42) can be provided.

In the semiconductor device (1) according to one aspect, a direction along a side of the support substrate (21) at which the outer peripheral-side power supply terminal group (16g) is disposed with the semiconductor module (5) mounted on the main substrate (3) is defined as a width direction (X); and the outer peripheral-side power supply terminal group (16g) is disposed so as to be arranged continuously in the width direction (X) such that a first path width (W1), which is a length of the first power supply path (41) in the width direction (X), meets a first reference value, which is an electrical reference value for a first power source to be supplied to the semiconductor module (5) via the first power supply path (41).

In general, a large current flows through wiring through which a power source is supplied compared to signal wires, and therefore such wiring has a large wire width compared to the signal wires in order to have a large cross-sectional area. A necessary wire width can be secured for the first power supply path (41) with the outer peripheral-side power supply terminal group (16g) arranged continuously in the width direction (X) in order to meet the first reference value.

Here, preferably, a second reference value, which is an electrical reference value for a second power source to be supplied to the semiconductor module (5) via the second power supply path (42), is a reference value with a narrower allowable range than that of the first reference value.

In the case where the second reference value has a narrower allowable range than that of the first reference value and imposes a stricter condition, priority is occasionally given to a condition for forming the second power supply path (42), rather than the first power supply path (41), such as increasing the cross-sectional area of the wiring, for example. The second power supply path (42) is formed in a wiring layer that is different from the surface layer wiring layer (31) on which the semiconductor module (5) is mounted, and thus constraints on the mounting and constraints on the signal wires in the surface layer wiring layer (31) can be preferably suppressed.

In one aspect, preferably, of the connection terminals (10) included in the outer peripheral-side terminal group (16g), connection terminals (10) disposed at positions at which signal wires (W) can occasionally be led out toward an outer peripheral side with respect to the outermost peripheral terminal (18) only by way of the through holes (TH) depending on presence or absence of signal wires (W) led out from the connection terminals (10) disposed on an outer peripheral side with respect to such terminals with the semiconductor module (5) mounted on the main substrate (3) are defined as difficult connection terminals (19); of the difficult connection terminals (19), terminals assigned to usage that does not require the signal wires (W) to be led out toward the outer peripheral side with respect to the outermost peripheral terminal (18) are defined as non-signal connection terminals; and the non-signal connection terminals are disposed so as to be arranged continuously in the width direction (X) such that a second path width (W2), which is a length of the second power supply path (42) in the width direction (X), meets the second reference value.

There is no need to provide through holes (TH) at positions to which the non-signal connection terminals are connected even if the connection terminals (10) are the difficult connection terminals (19). A necessary wire width can be secured for the second power supply path (42) with the non-signal connection terminals arranged continuously in the width direction (X) in order to meet the second reference value.

In one aspect, preferably, the second path width (W2) is larger than the first path width (W1); and of the connection terminals (10) included in the outer peripheral-side terminal group (18), connection terminals (10) that overlap the second power supply path (42) as seen in the orthogonal direction (Z) with the semiconductor module (5) mounted on the main substrate (3) and that are not included in the outer peripheral-side power supply terminal group (16g) and the non-signal connection terminals are disposed at positions at which signal wires (W) can be led out toward the outer peripheral side with respect to the outermost peripheral terminal (18) not by way of the through holes (TH).

There is no need to provide a through hole (TH) at any of the positions to which the connection terminals (10) which overlap the second power supply path (42) as seen in the orthogonal direction (Z) are connected, which suppresses a decrease in the effective area of the second power supply path (42) and enables stable power supply.

In one aspect, preferably, connection terminals (10), of the non-signal connection terminals, other than the connection terminals (10) which are assigned to the outer peripheral-side power supply terminal group (16g) in order to meet the first reference value are assigned to a ground terminal or an NC terminal through which a signal is not input or output.

The ground terminal and the NC terminal are not required to be connected to other wiring layers via the through holes (TH), and thus are suitable as the non-signal connection terminals.

In one aspect, preferably, in the case where the difficult connection terminals (19) are assigned to the connection terminals (10) with attributes of two or more of the connection terminal (10) which belongs to the outer peripheral-side power supply terminal group (16g), the ground terminal, and a signal terminal, an order of priority in assignment of the difficult connection terminals (19) is determined such that the connection terminal (10) which belongs to the outer peripheral-side power supply terminal group (16g), the ground terminal, and the signal terminal are sequentially provided from a center side of the support substrate (21) toward an outer peripheral side.

It is more likely that the signal wires (W) which are connected to the connection terminals (10) disposed more toward the outer peripheral side can be led out toward the outer peripheral side with respect to the outermost peripheral terminal (18) through the surface layer wiring layer (31) not via the through holes (TH). Thus, the difficult connection terminals (19) are preferably assigned to the connection terminals (10) in the order of priority described above.

Preferably, the first reference value includes a first rated current value which is a rated current value of the first power source, the second reference value includes a second rated current value which is a rated current value of the second power source, and the second rated current value is larger than the first rated current value.

In the case where the second rated current value is larger than the first rated current value, priority is occasionally given to a condition for forming the second power supply path (42), rather than the first power supply path (41), such as increasing the cross-sectional area of the wiring, for example. The second power supply path (42) is formed in a wiring layer that is different from the surface layer wiring layer (31) on which the semiconductor module (5) is mounted, and thus constraints on the mounting and constraints on the signal wires in the surface layer wiring layer (31) can be preferably suppressed.

Preferably, the first reference value includes a first impedance which is a maximum allowable value of an impedance of the first power supply path (41), the second reference value includes a second impedance which is a maximum allowable value of an impedance of the second power supply path, and the second impedance is lower than the first impedance.

In the case where the second impedance is lower than the first impedance, priority is occasionally given to a condition for forming the second power supply path (42), rather than the first power supply path (41). The second power supply path (42) is formed in a wiring layer that is different from the surface layer wiring layer (31) on which the semiconductor module (5) is mounted, and thus constraints on the mounting and constraints on the signal wires in the surface layer wiring layer (31) can be preferably suppressed.

In one aspect, preferably, the target semiconductor element (51T) has power supply terminals of at least three systems; the inner peripheral-side terminal group (14g) further includes a third inner peripheral-side power supply terminal group (143g) of a different system from the first inner peripheral-side power supply terminal group (141g) and the second inner peripheral-side power supply terminal group (142g); and the outer peripheral-side power supply terminal group (16g) includes a second outer peripheral-side power supply terminal group (162g) of the same system as the third inner peripheral-side power supply terminal group (143g), in addition to a first outer peripheral-side power supply terminal group (161g) of the same system as the first inner peripheral-side power supply terminal group (141g).

The surface layer power supply path (40) can be provided in correspondence with two systems of power sources, and thus a semiconductor device (1) that is capable of suppressing a decrease in the effective area of wiring due to through holes (TH) and enables stable power supply to the semiconductor module (5) can be provided.

Preferably, a direction along a side of the support substrate (21) at which the outer peripheral-side power supply terminal group (16g) is disposed with the semiconductor module (51) mounted on the main substrate (3) is defined as a width direction (X); and the first inner peripheral-side power supply terminal group (141g) and the third inner peripheral-side power supply terminal group (143g) are disposed such that at least some of the terminals are side by side with each other in the width direction (X), and the first outer peripheral-side power supply terminal group (161g) and the second outer peripheral-side power supply terminal group (162g) are disposed such that at least some of the terminals are side by side with each other in the width direction (X).

Two surface layer power supply paths (41, 43) corresponding to two systems of power sources can be arranged side by side so as to extend in parallel in the width direction (X), and thus the two surface layer power supply paths (41, 43) can be formed with a high wiring efficiency.

Preferably, a direction from a center of the support substrate (21) toward an outer peripheral side of the support substrate (21) along a normal to a side of the support substrate (21) at which the outer peripheral-side power supply terminal group (16g) is disposed is defined as an outer peripheral direction (Y); and the first inner peripheral-side power supply terminal group (141g) is disposed on a side of the outer peripheral direction (Y) with respect to the second inner peripheral-side power supply terminal group (142g).

The first inner peripheral-side power supply terminal group (141g), of the inner peripheral-side power supply terminal group (14g), is disposed on the side on which the first power supply path (41) serving as the surface layer power supply path (40) extends toward the outer peripheral side, and thus the first power supply path (41) can be formed with a high wiring efficiency.

In one aspect, preferably, the semiconductor elements (51) are each a semiconductor die (51C, 51P), and the semiconductor module (5) is a semiconductor chip (5C, 5P) in which a plurality of semiconductor dies (51C, 51P) are sealed in a package (2) that includes the support substrate (21).

The semiconductor module (5) with an appropriate terminal arrangement can be achieved by changing the terminal arrangement of the semiconductor dies (51C, 51P) on the support substrate (21).

In one aspect, preferably, the semiconductor elements (51) are each a semiconductor chip (51M) in which at least one semiconductor die is sealed in a package, and the semiconductor module (5) is a chip module (5M) in which a plurality of semiconductor chips (51M) are mounted on the support substrate (21).

The semiconductor module (5) with an appropriate terminal arrangement can be achieved by changing the terminal arrangement of the semiconductor chip (51M) on the support substrate (21).

DESCRIPTION OF THE REFERENCE NUMERALS

1 SEMICONDUCTOR DEVICE
3 CIRCUIT SUBSTRATE (MAIN SUBSTRATE)
5 SEMICONDUCTOR MODULE
5M MULTI-CHIP MODULE (CHIP MODULE)
10 TERMINAL (CONNECTION TERMINAL)
11g FIRST POWER SUPPLY TERMINAL GROUP (FIRST INNER PERIPHERAL-SIDE POWER SUPPLY TERMINAL GROUP)
12g SECOND POWER SUPPLY TERMINAL GROUP (SECOND INNER PERIPHERAL-SIDE POWER SUPPLY TERMINAL GROUP)
13g THIRD POWER SUPPLY TERMINAL GROUP (THIRD INNER PERIPHERAL-SIDE POWER SUPPLY TERMINAL GROUP)
14 INNER PERIPHERAL-SIDE POWER SUPPLY TERMINAL
14g INNER PERIPHERAL-SIDE POWER SUPPLY TERMINAL GROUP
15 INNER PERIPHERAL-SIDE TERMINAL GROUP
16 OUTER PERIPHERAL-SIDE POWER SUPPLY TERMINAL
16g OUTER PERIPHERAL-SIDE POWER SUPPLY TERMINAL GROUP
17 OUTER PERIPHERAL-SIDE TERMINAL GROUP
18 OUTERMOST PERIPHERAL TERMINAL
19 DIFFICULT CONNECTION TERMINAL
21 SUPPORT SUBSTRATE
21a UPPER SURFACE
21b LOWER SURFACE
21m MODULE SUBSTRATE (SUPPORT SUBSTRATE)
31 FIRST SURFACE LAYER WIRING LAYER (SURFACE LAYER WIRING LAYER ON WHICH SEMICONDUCTOR MODULE IS MOUNTED)
32 FIRST INNER LAYER WIRING LAYER (INNER LAYER WIRING LAYER)
33 SECOND INNER LAYER WIRING LAYER (INNER LAYER WIRING LAYER)
40 SURFACE LAYER POWER SUPPLY WIRE (SURFACE LAYER POWER SUPPLY PATH)
41 FIRST POWER SUPPLY WIRE (FIRST POWER SUPPLY PATH)
42 SECOND POWER SUPPLY WIRE (SECOND POWER SUPPLY PATH)
43 THIRD POWER SUPPLY WIRE (THIRD POWER SUPPLY PATH)
44 FOURTH POWER SUPPLY WIRE (FOURTH POWER SUPPLY PATH)
51 SEMICONDUCTOR ELEMENT
51T TARGET SEMICONDUCTOR ELEMENT
51b SUPPORTED SURFACE
51p PROCESSOR (SEMICONDUCTOR CHIP, TARGET SEMICONDUCTOR ELEMENT)
51M SEMICONDUCTOR CHIP
55 CHIP TERMINAL
56 CHIP POWER SUPPLY TERMINAL
R1 ARRANGEMENT REGION
R1e OUTER EDGE OF ARRANGEMENT REGION
TH THROUGH HOLE
B PACKAGE SUBSTRATE
D SEMICONDUCTOR DIE
W SIGNAL WIRE
W1 FIRST POWER SUPPLY WIRE WIDTH (FIRST PATH WIDTH)
W2 SECOND POWER SUPPLY WIRE WIDTH (SECOND PATH WIDTH)
X WIDTH DIRECTION
Z ORTHOGONAL DIRECTION

The invention claimed is:

1. A semiconductor device comprising:
a chip module that includes a module substrate in a rectangular plate shape, on an upper surface of which at least one semiconductor chip is supported and fixed, and a plurality of connection terminals disposed planarly along a lower surface of the module substrate and electrically connected to the semiconductor chip, the semiconductor chip including a package substrate and at least one semiconductor die supported by the package substrate; and
a main substrate which has a plurality of wiring layers and on which the chip module is surface-mounted via the plurality of connection terminals, the main substrate being formed with a plurality of through holes that penetrate the main substrate and that enable the plurality of wiring layers to be electrically connected to each other, wherein
the semiconductor chip has a plurality of chip terminals disposed planarly along a supported surface supported by the module substrate and electrically connected to the module substrate,
the plurality of chip terminals include a plurality of chip power supply terminals through which power is supplied to the semiconductor chip,
the plurality of chip power supply terminals are disposed on an inner side with respect to an outer edge of an arrangement region in which the plurality of chip terminals are disposed planarly, the chip module is configured such that the semiconductor chip is mounted on the module substrate, and an arrangement of the plurality of chip terminals and an arrangement of the plurality of connection terminals are changed in the module substrate, the plurality of connection terminals are arranged in a plurality of rectangular rings along sides of the module substrate, and the plurality of connection terminals include an inner peripheral-side terminal group arranged on a center side of the module substrate and an outer peripheral-side terminal group arranged on an outer peripheral side with respect to the inner peripheral-side terminal group, the inner peripheral-side terminal group includes an inner peripheral-side power supply terminal group through which power is supplied to the semiconductor chip, the outer peripheral-side terminal group includes an outer peripheral-side power supply terminal group of the same system as at least a part of the inner peripheral-side power supply terminal group, the inner peripheral-side power supply terminal group is disposed at a position at which at least a part of the inner peripheral-side power supply terminal group overlaps the semiconductor chip as seen in a direction that is orthogonal to a plate surface of the module substrate, the outer peripheral-side power supply terminal group is arranged so as to be continuous from the inner peripheral-side power supply terminal group to an outermost peripheral terminal of the outer peripheral-side terminal group, the main substrate has a surface layer power supply path, through which power is supplied to the semiconductor chip via the inner peripheral-side power supply terminal group and the outer peripheral-side power supply terminal group, in a surface layer wiring layer on which the chip module is mounted, and the surface layer power supply path overlaps the inner peripheral-side power supply terminal group and the outer peripheral-side power supply terminal group as seen in an orthogonal direction that is orthogonal to a substrate surface of the main substrate with the chip module mounted on the main substrate, and is formed continuously so as to extend from a position at which the surface layer power supply path is connected to the inner peripheral-side power supply terminal group toward an outer peripheral side of the main substrate.

2. The semiconductor device according to claim 1, wherein
the inner peripheral-side power supply terminal group includes a first inner peripheral-side power supply terminal group and a second inner peripheral-side power supply terminal group as power supply terminal groups through which at least two different systems of power are supplied to the semiconductor chip,
the outer peripheral-side power supply terminal group does not include a terminal of the same system as the second inner peripheral-side power supply terminal group, but includes a terminal of the same system as the first inner peripheral-side power supply terminal group,
the surface layer power supply path is a first power supply path that does not overlap the second inner peripheral-side power supply terminal group as seen in the orthogonal direction, but that overlaps the first inner peripheral-side power supply terminal group and the outer peripheral-side power supply terminal group to be connected to the first inner peripheral-side power supply terminal group and the outer peripheral-side power supply terminal group,
the main substrate further includes a second power supply path formed in a wiring layer that is different from the surface layer wiring layer on which the chip module is mounted, the second power supply path being formed continuously so as to extend from a position at which the second power supply path is connected to the second inner peripheral-side power supply terminal group toward the outer peripheral side of the main substrate, and
the first power supply path and the second power supply path at least partially overlap each other as seen in the orthogonal direction.

3. The semiconductor device according to claim 2, wherein:
a direction along a side of the module substrate at which the outer peripheral-side power supply terminal group is disposed with the chip module mounted on the main substrate is defined as a width direction,
the outer peripheral-side power supply terminal group is disposed so as to be arranged continuously in the width direction such that a first path width, which is a length of the first power supply path in the width direction, meets a first reference value, which is an electrical reference value for a first power source to be supplied to the chip module via the first power supply path.

4. The semiconductor device according to claim 3, wherein
a second reference value, which is an electrical reference value for a second power source to be supplied to the chip module via the second power supply path, is a reference value with a narrower allowable range than that of the first reference value.

5. The semiconductor device according to claim 4, wherein
of the connection terminals included in the outer peripheral-side terminal group, connection terminals disposed at positions at which signal wires can occasionally be led out toward an outer peripheral side with respect to the outermost peripheral terminal only by way of the through holes depending on presence or absence of signal wires led out from the connection terminals disposed on an outer peripheral side with respect to such terminals with the chip module mounted on the main substrate are defined as difficult connection terminals,
of the difficult connection terminals, terminals assigned to usage that does not require the signal wires to be led out toward the outer peripheral side with respect to the outermost peripheral terminal are defined as non-signal connection terminals, and
the non-signal connection terminals are disposed so as to be arranged continuously in the width direction such that a second path width, which is a length of the second power supply path in the width direction, meets the second reference value.

6. The semiconductor device according to claim 5, wherein
the second path width is larger than the first path width, and
of the connection terminals included in the outer peripheral-side terminal group, connection terminals that overlap the second power supply path as seen in the orthogonal direction with the chip module mounted on the main substrate and that are not included in the outer peripheral-side power supply terminal group and the non-signal connection terminals are disposed at positions at which signal wires can be led out toward the outer peripheral side with respect to the outermost peripheral terminal not by way of the through holes.

7. The semiconductor device according to claim 5, wherein
connection terminals, of the non-signal connection terminals, other than the connection terminals which are assigned to the outer peripheral-side power supply terminal group in order to meet the first reference value are assigned to a ground terminal or an NC terminal through which a signal is not input or output.

8. The semiconductor device according to claim 7, wherein
in the case where the difficult connection terminals are assigned to the connection terminals with attributes of two or more of the connection terminal which belongs to the outer peripheral-side power supply terminal group, the ground terminal, and a signal terminal, an order of priority in assignment of the difficult connection terminals is determined such that the connection terminal which belongs to the outer peripheral-side power supply terminal group, the ground terminal, and the signal terminal are sequentially provided from a center side of the module substrate toward an outer peripheral side.

9. The semiconductor device according to claim 4, wherein
the first reference value includes a first rated current value which is a rated current value of the first power source, the second reference value includes a second rated current value which is a rated current value of the second power source, and the second rated current value is larger than the first rated current value.

10. The semiconductor device according to claim 4, wherein
the first reference value includes a first impedance which is a maximum allowable value of an impedance of the first power supply path, the second reference value includes a second impedance which is a maximum allowable value of an impedance of the second power supply path, and the second impedance is lower than the first impedance.

11. The semiconductor device according to claim 2, wherein:
the semiconductor chip has power supply terminals of at least three systems,
the inner peripheral-side terminal group further includes a third inner peripheral-side power supply terminal group of a different system from the first inner peripheral-side power supply terminal group and the second inner peripheral-side power supply terminal group, and
the outer peripheral-side power supply terminal group includes a second outer peripheral-side power supply terminal group of the same system as the third inner peripheral-side power supply terminal group, in addition to a first outer peripheral-side power supply terminal group of the same system as the first inner peripheral-side power supply terminal group.

12. The semiconductor device according to claim 11, wherein
a direction along a side of the module substrate at which the outer peripheral-side power supply terminal group is disposed with the chip module mounted on the main substrate is defined as a width direction, and
the first inner peripheral-side power supply terminal group and the third inner peripheral-side power supply terminal group are disposed such that at least some of the plurality of connection terminals of the first inner peripheral-side power supply terminal group and the third inner peripheral-side power supply terminal group are side by side with each other in the width direction, and
the first outer peripheral-side power supply terminal group and the second outer peripheral-side power supply terminal group are disposed such that at least some of the plurality of connection terminals of the first outer peripheral-side power supply terminal group and the second outer peripheral-side power supply terminal are side by side with each other in the width direction.

13. The semiconductor device according to claim 2, wherein
a direction from a center of the module substrate toward an outer peripheral side of the module substrate along a normal to a side of the module substrate at which the outer peripheral-side power supply terminal group is disposed is defined as an outer peripheral direction, and
the first inner peripheral-side power supply terminal group is disposed on a side of the outer peripheral direction with respect to the second inner peripheral-side power supply terminal group.

14. A chip module that includes a module substrate in a rectangular plate shape, on an upper surface of which at least one semiconductor chip is supported and fixed, and a plurality of connection terminals disposed planarly along a lower surface of the module substrate and electrically connected to the semiconductor chip, the semiconductor chip including a package substrate and at least one semiconductor die supported by the package substrate, wherein:
the semiconductor chip has a plurality of chip terminals disposed planarly along a supported surface supported by the module substrate and electrically connected to the module substrate,
the plurality of chip terminals include a plurality of chip power supply terminals through which power is supplied to the semiconductor chip,
the plurality of chip power supply terminals are disposed on an inner side with respect to an outer edge of an arrangement region in which the plurality of chip terminals are disposed planarly,
the semiconductor chip is mounted on the module substrate,
an arrangement of the plurality of chip terminals and an arrangement of the plurality of connection terminals are changed in the module substrate,
the plurality of connection terminals are arranged in a plurality of rectangular rings along sides of the module substrate, and the plurality of connection terminals include an inner peripheral-side terminal group arranged on a center side of the module substrate and an outer peripheral-side terminal group arranged on an outer peripheral side with respect to the inner peripheral-side terminal group,
the inner peripheral-side terminal group includes an inner peripheral-side power supply terminal group connected to a power supply terminal of the semiconductor chip,
the outer peripheral-side terminal group includes an outer peripheral-side power supply terminal group of the same system as at least a part of the inner peripheral-side power supply terminal group,
the inner peripheral-side power supply terminal group is disposed at a position at which at least a part of the inner peripheral-side power supply terminal group overlaps the semiconductor chip as seen in a direction that is orthogonal to a plate surface of the module substrate, and the outer peripheral-side power supply terminal group is arranged so as to be continuous from the inner peripheral-side power supply terminal group to an outermost peripheral terminal of the outer peripheral-side terminal group.

15. The chip module according to claim 14, wherein the inner peripheral-side power supply terminal group includes a first inner peripheral-side power supply terminal group and a second inner peripheral-side power supply terminal group as power supply terminal groups to be connected to power supply terminals of at least two different systems of the semiconductor chip, and the outer peripheral-side power supply terminal group does not include a terminal of the same system as the second inner peripheral-side power supply terminal group, but includes a terminal of the same system as the first inner peripheral-side power supply terminal group.

16. A semiconductor device comprising:

a semiconductor module that includes a support substrate in a rectangular plate shape, on an upper surface of which one or more semiconductor elements are supported and fixed, and a plurality of connection terminals disposed planarly along a lower surface of the support substrate and electrically connected to the semiconductor elements; and a main substrate which has a plurality of wiring layers and on which the semiconductor module is surface-mounted via the plurality of connection terminals, the main substrate being formed with a plurality of through holes that penetrate the main substrate and that enable the plurality of wiring layers to be electrically connected to each other, wherein the plurality of connection terminals are arranged in a plurality of rectangular rings along sides of the support substrate, and the plurality of connection terminals include an inner peripheral-side terminal group arranged on a center side of the support substrate and an outer peripheral-side terminal group arranged on an outer peripheral side with respect to the inner peripheral-side terminal group, the inner peripheral-side terminal group includes an inner peripheral-side power supply terminal group through which power is supplied to a target semiconductor element which is one of the semiconductor elements, the outer peripheral-side terminal group includes an outer peripheral-side power supply terminal group of the same system as at least a part of the inner peripheral-side power supply terminal group, the inner peripheral-side power supply terminal group is disposed at a position at which at least a part of the inner peripheral-side power supply terminal group overlaps the target semiconductor element as seen in a direction that is orthogonal to a plate surface of the support substrate, the outer peripheral-side power supply terminal group is arranged so as to be continuous from the inner peripheral-side power supply terminal group to an outermost peripheral terminal of the outer peripheral-side terminal group, the main substrate has a surface layer power supply path, through which power is supplied to the target semiconductor element via the inner peripheral-side power supply terminal group and the outer peripheral-side power supply terminal group, in a surface layer wiring layer on which the semiconductor module is mounted, and the surface layer power supply path overlaps the inner peripheral-side power supply terminal group and the outer peripheral-side power supply terminal group as seen in an orthogonal direction that is orthogonal to a substrate surface of the main substrate with the semiconductor module mounted on the main substrate, and is formed continuously so as to extend from a position at which the surface layer power supply path is connected to the inner peripheral-side power supply terminal group toward an outer peripheral side of the main substrate.

17. The semiconductor device according to claim 16, wherein the inner peripheral-side power supply terminal group includes a first inner peripheral-side power supply terminal group and a second inner peripheral-side power supply terminal group as power supply terminal groups through which at least two different systems of power are supplied to the target semiconductor element, the outer peripheral-side power supply terminal group does not include a terminal of the same system as the second inner peripheral-side power supply terminal group, but includes a terminal of the same system as the first inner peripheral-side power supply terminal group, the surface layer power supply path is a first power supply path that does not overlap the second inner peripheral-side power supply terminal group as seen in the orthogonal direction, but that overlaps the first inner peripheral-side power supply terminal group and the outer peripheral-side power supply terminal group to be connected to the first inner peripheral-side power supply terminal group and the outer peripheral-side power supply terminal group, the main substrate further includes a second power supply path formed in a wiring layer that is different from the surface layer wiring layer on which the semiconductor module is mounted, the second power supply path being formed continuously so as to extend from a position at which the second power supply path is connected to the second inner peripheral-side power supply terminal group toward the outer peripheral side of the main substrate, and the first power supply path and the second power supply path at least partially overlap each other as seen in the orthogonal direction.

18. The semiconductor device according to claim 17, wherein a direction along a side of the support substrate at which the outer peripheral-side power supply terminal group is disposed with the semiconductor module mounted on the main substrate is defined as a width direction, and the outer peripheral-side power supply terminal group is disposed so as to be arranged continuously in the width direction such that a first path width, which is a length of the first power supply path in the width direction, meets a first reference value, which is an electrical reference value for a first power source to be supplied to the semiconductor module via the first power supply path.

19. The semiconductor device according to claim 18, wherein
a second reference value, which is an electrical reference value for a second power source to be supplied to the semiconductor module via the second power supply path, is a reference value with a narrower allowable range than that of the first reference value.

20. The semiconductor device according to claim 19, wherein:
of the connection terminals included in the outer peripheral-side terminal group, connection terminals disposed at positions at which signal wires can occasionally be led out toward an outer peripheral side with respect to the outermost peripheral terminal only by way of the through holes depending on presence or absence of signal wires led out from the connection terminals disposed on an outer peripheral side with respect to such terminals with the semiconductor module mounted on the main substrate are defined as difficult connection terminals,
of the difficult connection terminals, terminals assigned to usage that does not require the signal wires to be led out toward the outer peripheral side with respect to the outermost peripheral terminal are defined as non-signal connection terminals, and
the non-signal connection terminals are disposed so as to be arranged continuously in the width direction such that a second path width, which is a length of the second power supply path in the width direction, meets the second reference value.

21. The semiconductor device according to claim 20, wherein
the second path width is larger than the first path width, and
of the connection terminals included in the outer peripheral-side terminal group, connection terminals that overlap the second power supply path as seen in the orthogonal direction with the semiconductor module mounted on the main substrate and that are not included in the outer peripheral-side power supply terminal group and the non-signal connection terminals are disposed at positions at which signal wires can be led out toward the outer peripheral side with respect to the outermost peripheral terminal not by way of the through holes.

22. The semiconductor device according to claim 20, wherein
connection terminals, of the non-signal connection terminals, other than the connection terminals which are assigned to the outer peripheral-side power supply terminal group in order to meet the first reference value are assigned to a ground terminal or an NC terminal through which a signal is not input or output.

23. The semiconductor device according to claim 22, wherein
in the case where the difficult connection terminals are assigned to the connection terminals with attributes of two or more of the connection terminal which belongs to the outer peripheral-side power supply terminal group, the ground terminal, and a signal terminal, an order of priority in assignment of the difficult connection terminals is determined such that the connection terminal which belongs to the outer peripheral-side power supply terminal group, the ground terminal, and the signal terminal are sequentially provided from a center side of the support substrate toward an outer peripheral side.

24. The semiconductor device according to claim 19, wherein
the first reference value includes a first rated current value which is a rated current value of the first power source, the second reference value includes a second rated current value which is a rated current value of the second power source, and the second rated current value is larger than the first rated current value.

25. The semiconductor device according to claim 19, wherein
the first reference value includes a first impedance which is a maximum allowable value of an impedance of the first power supply path, the second reference value includes a second impedance which is a maximum allowable value of an impedance of the second power supply path, and the second impedance is lower than the first impedance.

26. The semiconductor device according to claim 17, wherein:
the target semiconductor element has power supply terminals of at least three systems,
the inner peripheral-side terminal group further includes a third inner peripheral-side power supply terminal group of a different system from the first inner peripheral-side power supply terminal group and the second inner peripheral-side power supply terminal group, and
the outer peripheral-side power supply terminal group includes a second outer peripheral-side power supply terminal group of the same system as the third inner peripheral-side power supply terminal group, in addition to a first outer peripheral-side power supply terminal group of the same system as the first inner peripheral-side power supply terminal group.

27. The semiconductor device according to claim 26, wherein
a direction along a side of the support substrate at which the outer peripheral-side power supply terminal group is disposed with the semiconductor module mounted on the main substrate is defined as a width direction, and
the first inner peripheral-side power supply terminal group and the third inner peripheral-side power supply terminal group are disposed such that at least some of the plurality of connection terminals of the first inner peripheral-side power supply terminal group and the third inner peripheral-side power supply terminal group are side by side with each other in the width direction, and
the first outer peripheral-side power supply terminal group and the second outer peripheral-side power supply terminal group are disposed such that at least some of the plurality of connection terminals of the first outer peripheral-side power supply terminal group and the second outer peripheral-side power supply terminal are side by side with each other in the width direction.

28. The semiconductor device according to claim 17, wherein:
a direction from a center of the support substrate toward an outer peripheral side of the support substrate along a normal to a side of the support substrate at which the outer peripheral-side power supply terminal group is disposed is defined as an outer peripheral direction, and
the first inner peripheral-side power supply terminal group is disposed on a side of the outer peripheral direction with respect to the second inner peripheral-side power supply terminal group.

29. The semiconductor device according to claim 16, wherein
- the semiconductor elements are each a semiconductor die, and the semiconductor module is a semiconductor chip in which a plurality of semiconductor dies are sealed in a package that includes the support substrate.

30. The semiconductor device according to claim 16, wherein
- the semiconductor elements are each a semiconductor chip in which at least one semiconductor die is sealed in a package, and the semiconductor module is a chip module in which a plurality of semiconductor chips are mounted on the support substrate.

* * * * *